(12) United States Patent
Tsai et al.

(10) Patent No.: US 11,196,015 B2
(45) Date of Patent: Dec. 7, 2021

(54) DISPLAY APPARATUS AND MANUFACTURING METHOD THEREOF

(71) Applicant: Au Optronics Corporation, Hsinchu (TW)

(72) Inventors: Shang-Ta Tsai, Hsinchu (TW); Yi-Hwa Song, Hsinchu (TW); Hsien-Hung Chen, Taoyuan (TW); Hsi-An Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/672,535

(22) Filed: Nov. 4, 2019

(65) Prior Publication Data

US 2020/0358019 A1 Nov. 12, 2020

(30) Foreign Application Priority Data

May 9, 2019 (TW) ................................. 108116012

(51) Int. Cl.
*H01L 51/50* (2006.01)
*H01L 51/52* (2006.01)
*H01L 51/56* (2006.01)

(52) U.S. Cl.
CPC ........ *H01L 51/504* (2013.01); *H01L 51/5271* (2013.01); *H01L 51/56* (2013.01); *H01L 2251/308* (2013.01); *H01L 2251/558* (2013.01)

(58) Field of Classification Search
CPC ............... H01L 51/504; H01L 51/5271; H01L 2251/308; H01L 2251/558
See application file for complete search history.

(56) References Cited

U.S. PATENT DOCUMENTS

| | | | | |
|---|---|---|---|---|
| 8,987,765 | B2* | 3/2015 | Bibi | .................... H01L 25/0753 257/98 |
| 9,991,320 | B2* | 6/2018 | Joung | ................. H01L 27/3244 |
| 2005/0040756 | A1* | 2/2005 | Winters | ............. H01L 51/5265 313/504 |
| 2005/0077816 | A1* | 4/2005 | Yamada | ............. H01L 51/5228 313/503 |
| 2006/0244368 | A1* | 11/2006 | Nagayama | ......... H01L 51/0021 313/504 |
| 2010/0176717 | A1* | 7/2010 | Lee | ..................... H01L 51/5271 313/504 |
| 2014/0159064 | A1* | 6/2014 | Sakariya | ................. H01L 33/60 257/88 |

(Continued)

FOREIGN PATENT DOCUMENTS

| | | |
|---|---|---|
| CN | 203536440 | 4/2014 |
| CN | 105463378 | 10/2018 |

(Continued)

*Primary Examiner* — Eugene Lee
(74) *Attorney, Agent, or Firm* — JCIPRNET

(57) ABSTRACT

A display apparatus and a manufacturing method of the display apparatus are provided. The display apparatus includes a substrate and a first sub-pixel located on the substrate. The first sub-pixel includes a first bottom electrode, a first light-emitting layer, and a first top electrode. The first light-emitting layer is located on the first bottom electrode. The first light-emitting layer includes a first groove structure or a first protrusion structure. The first top electrode is located on the first light-emitting layer.

20 Claims, 22 Drawing Sheets

(56) References Cited

U.S. PATENT DOCUMENTS

| | | | | |
|---|---|---|---|---|
| 2014/0346449 A1* | 11/2014 | Choi | .................... | H01L 51/5268 257/40 |
| 2015/0060840 A1* | 3/2015 | Nishimura | .......... | H01L 51/5206 257/40 |
| 2015/0069361 A1* | 3/2015 | Sato | .................... | H01L 27/3279 257/40 |
| 2015/0380466 A1* | 12/2015 | Koo | .................... | H01L 51/5275 257/40 |
| 2016/0104750 A1* | 4/2016 | Jinta | .................... | H01L 27/3216 257/40 |
| 2017/0125738 A1* | 5/2017 | Kim | .................... | H01L 51/5225 |
| 2017/0162830 A1* | 6/2017 | Hirakata | ............. | H01L 51/5281 |
| 2018/0053917 A1* | 2/2018 | Isaka | ................ | G02F 1/133602 |
| 2018/0076270 A1* | 3/2018 | Kwon | ................ | H01L 51/0097 |
| 2018/0190719 A1* | 7/2018 | Kim | .................... | H01L 51/5225 |
| 2019/0006626 A1* | 1/2019 | Kim | .................... | H01L 51/5262 |
| 2019/0096971 A1* | 3/2019 | Ukigaya | ............ | H01L 51/5012 |
| 2019/0097177 A1* | 3/2019 | Choi | ................ | H01L 31/02366 |
| 2019/0165321 A1* | 5/2019 | Choi | .................... | H01L 27/322 |
| 2019/0386248 A1* | 12/2019 | Itonaga | ................ | H01L 27/322 |
| 2020/0227669 A1* | 7/2020 | Guo | .................... | H01L 27/3211 |

FOREIGN PATENT DOCUMENTS

| | | |
|---|---|---|
| CN | 108878504 | 11/2018 |
| GB | 2564588 | 1/2019 |
| TW | 201813152 | 4/2018 |

\* cited by examiner

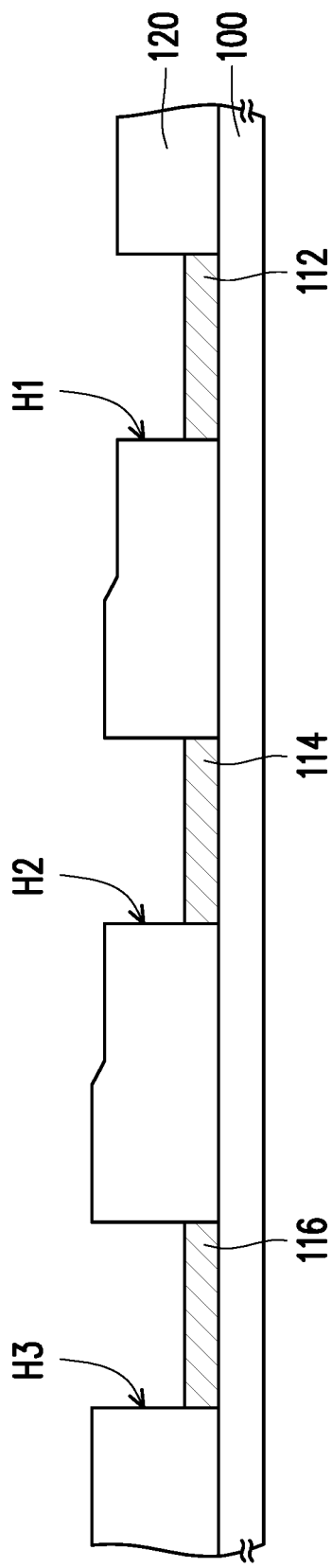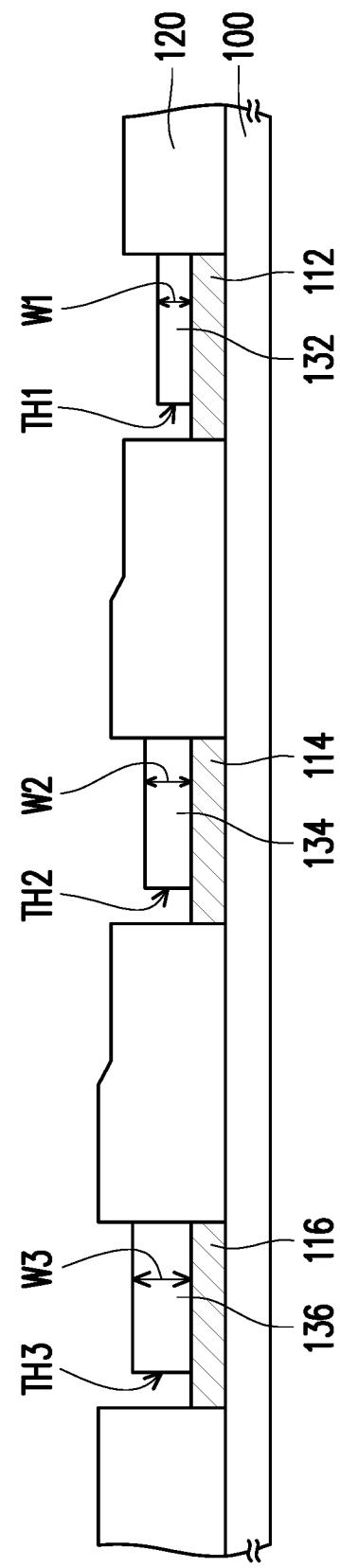

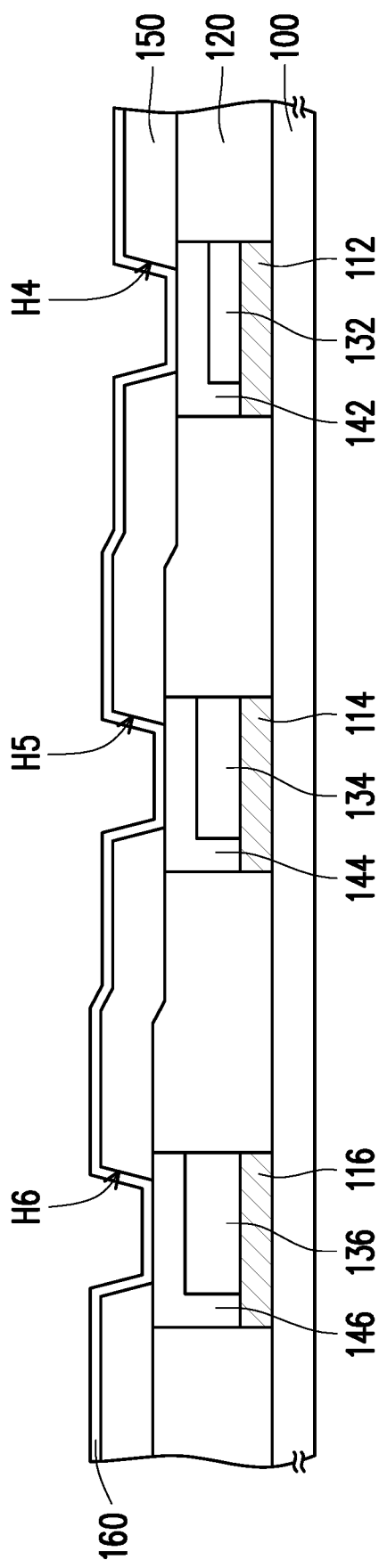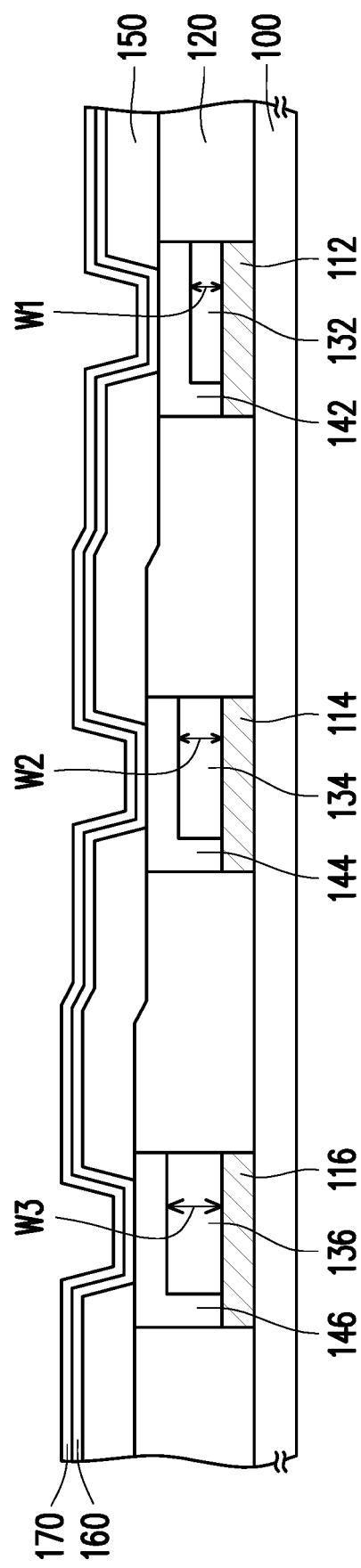
FIG. 1E
FIG. 1F

US 11,196,015 B2

DISPLAY APPARATUS AND MANUFACTURING METHOD THEREOF

CROSS-REFERENCE TO RELATED APPLICATION

This application claims the priority benefits of the Taiwan application Ser. No. 108116012, filed on May 9, 2019. The entirety of the above-mentioned patent application is hereby incorporated by reference herein and made a part of this specification.

BACKGROUND

Technical Field

The disclosure relates to a display apparatus and a manufacturing method thereof, and in particular, to a display apparatus with a light-emitting layer that has a sub-pixel and that has a groove structure or a protrusion structure and a manufacturing method thereof.

Description of Related Art

An organic light-emitting diode (OLED) is an electroluminescent semiconductor element having advantages of high efficiency, long lifespan, being not easy to be damaged, fast response speed, high reliability, and so on. However, in a high-resolution display apparatus, a distance between sub-pixels of different colors is small, and consequently light-emitting layers of the OLEDs of different colors are easily stacked with each other, resulting in a color mixing problem. Therefore, a method that can resolve the problem is needed.

SUMMARY

The disclosure provides a display apparatus, which can better resolve a color mixing problem of the display apparatus.

The disclosure provides a method for manufacturing a display apparatus, which can better resolve the color mixing problem of the display apparatus.

At least one embodiment of the disclosure provides a display apparatus. The display apparatus includes a substrate and a first sub-pixel located on the substrate. The first sub-pixel includes a first bottom electrode, a first light-emitting layer, and a first top electrode. The first light-emitting layer is located on the first bottom electrode. The first light-emitting layer includes a first groove structure or a first protrusion structure. The first top electrode is located on the first light-emitting layer.

At least one embodiment of the disclosure provides a method for manufacturing a display apparatus. The method for manufacturing the display apparatus includes: providing a substrate; forming a first bottom electrode on the substrate; forming a first light-emitting material layer on the first bottom electrode by using a first mask as a mask; forming a second light-emitting material layer on the first bottom electrode by using a second mask as a mask; and forming a first top electrode on a first light-emitting layer. The first light-emitting material layer and the second light-emitting material layer constitute the first light-emitting layer. The first light-emitting layer includes a first groove structure located between the first light-emitting material layer and the second light-emitting material layer or a first protrusion structure located at an overlapping portion where the first light-emitting material layer and the second light-emitting material layer are overlapped.

To make the features and advantages of the disclosure clear and easy to understand, the following gives a detailed description of embodiments with reference to accompanying drawings.

DESCRIPTION OF THE EMBODIMENTS

Figure 1C:
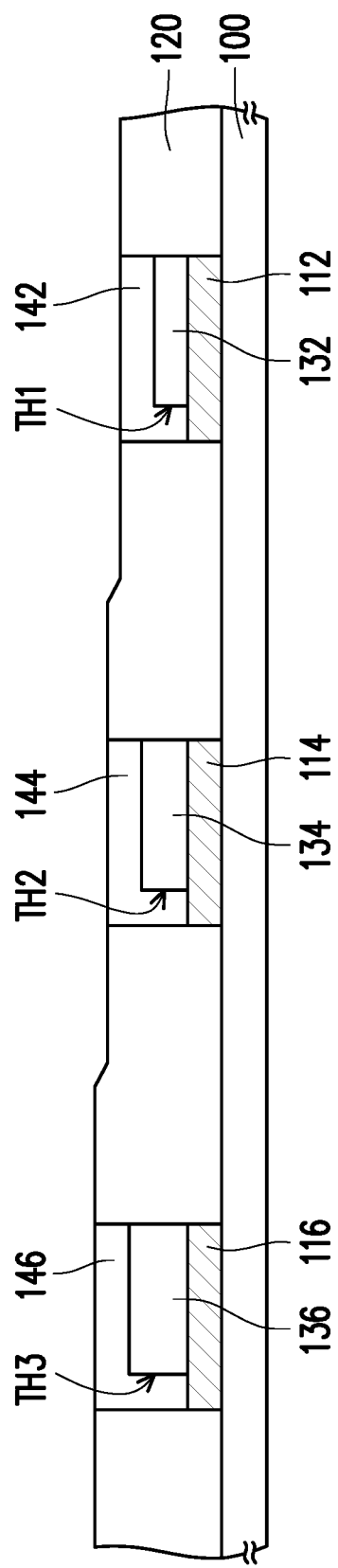
FIG. 1A to FIG. 1N are schematic cross-sectional views of a method for manufacturing a display apparatus according to an embodiment of the disclosure.
Figure 1D:
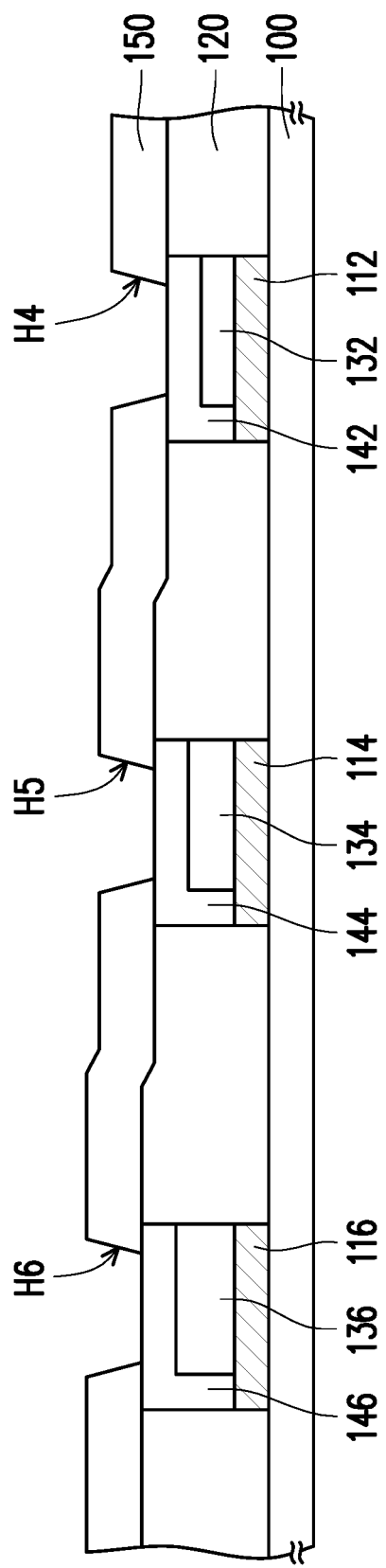
Figure 1G:
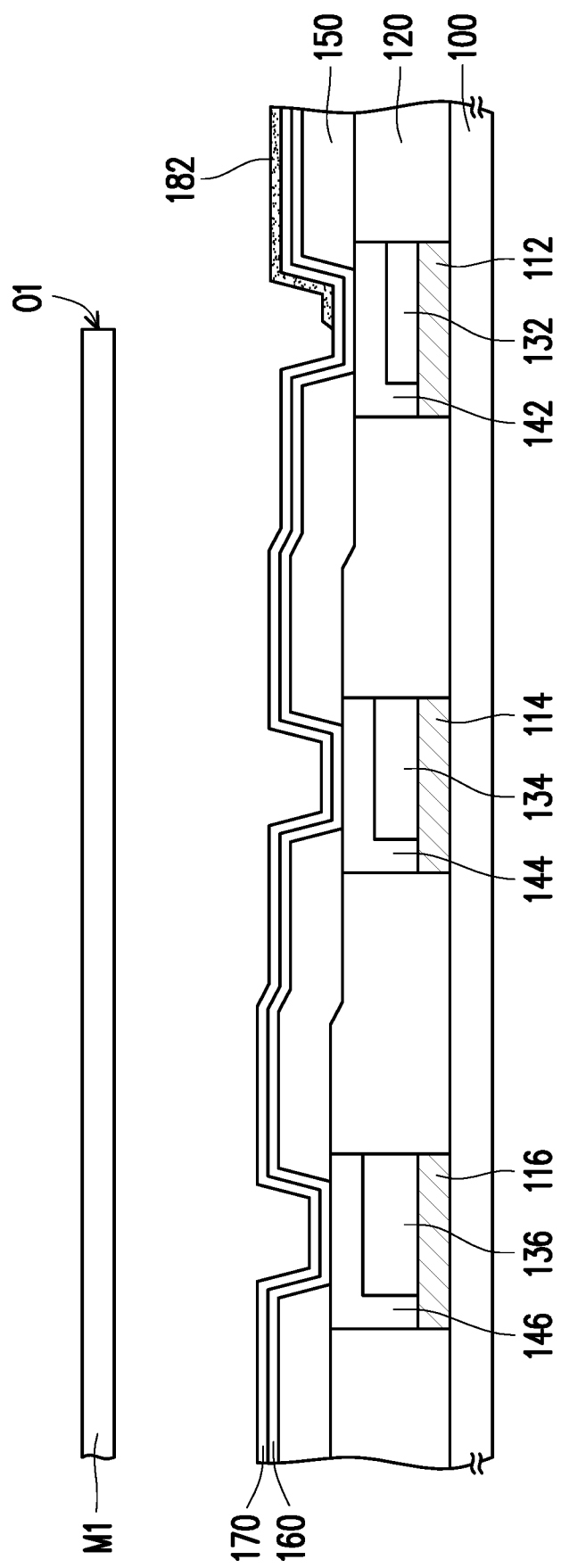
Figure 1H:
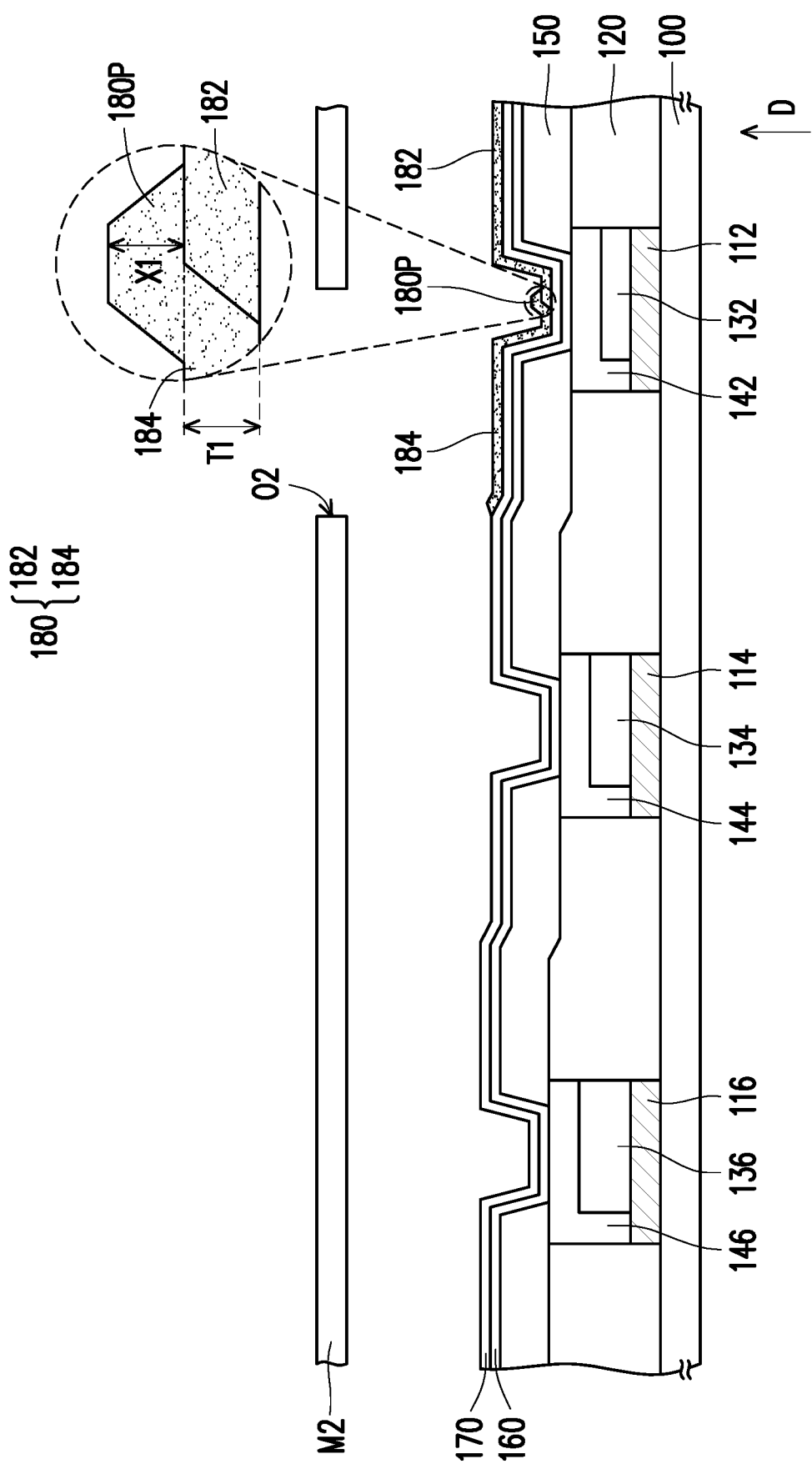
Figure 1I:
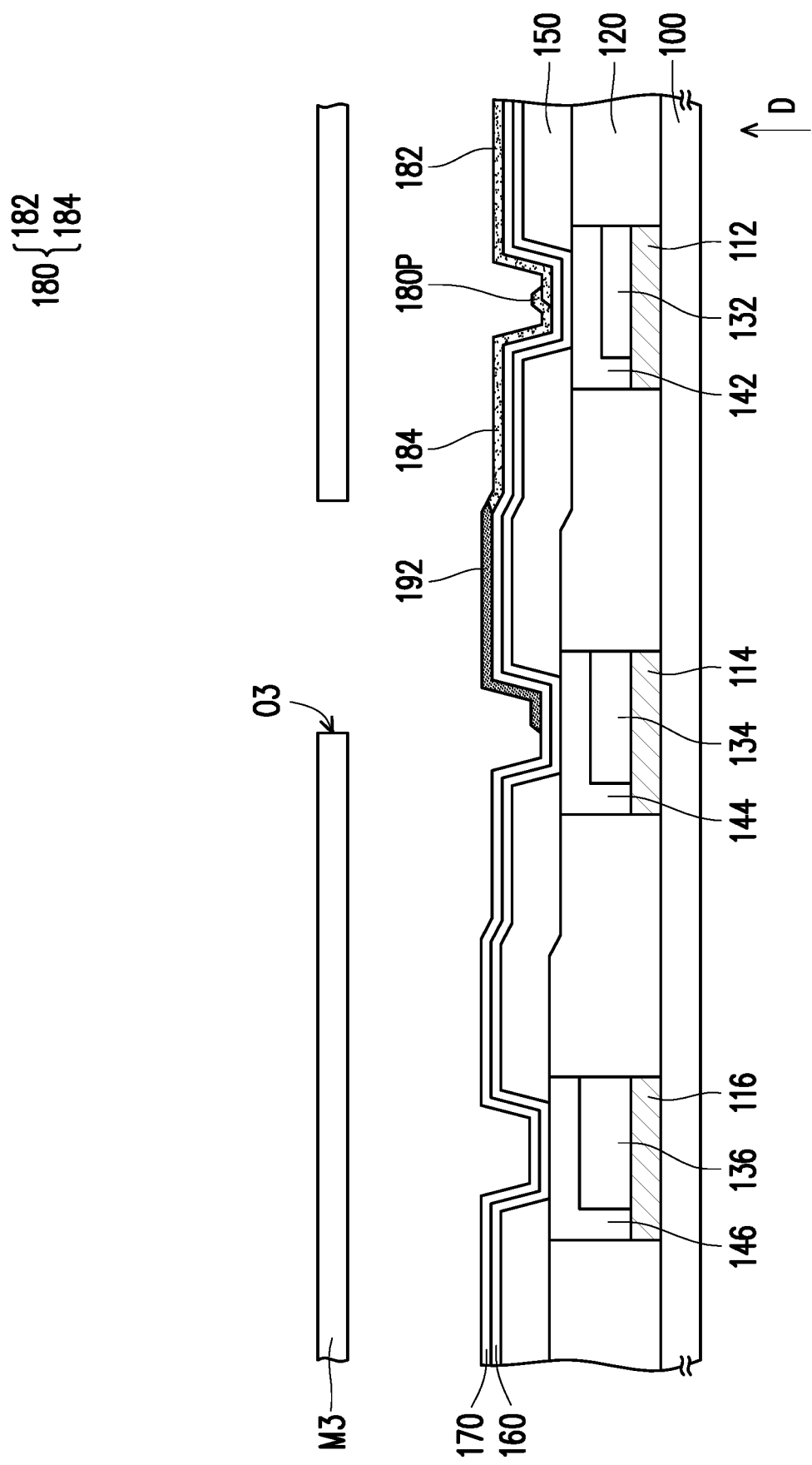
Figure 1J:
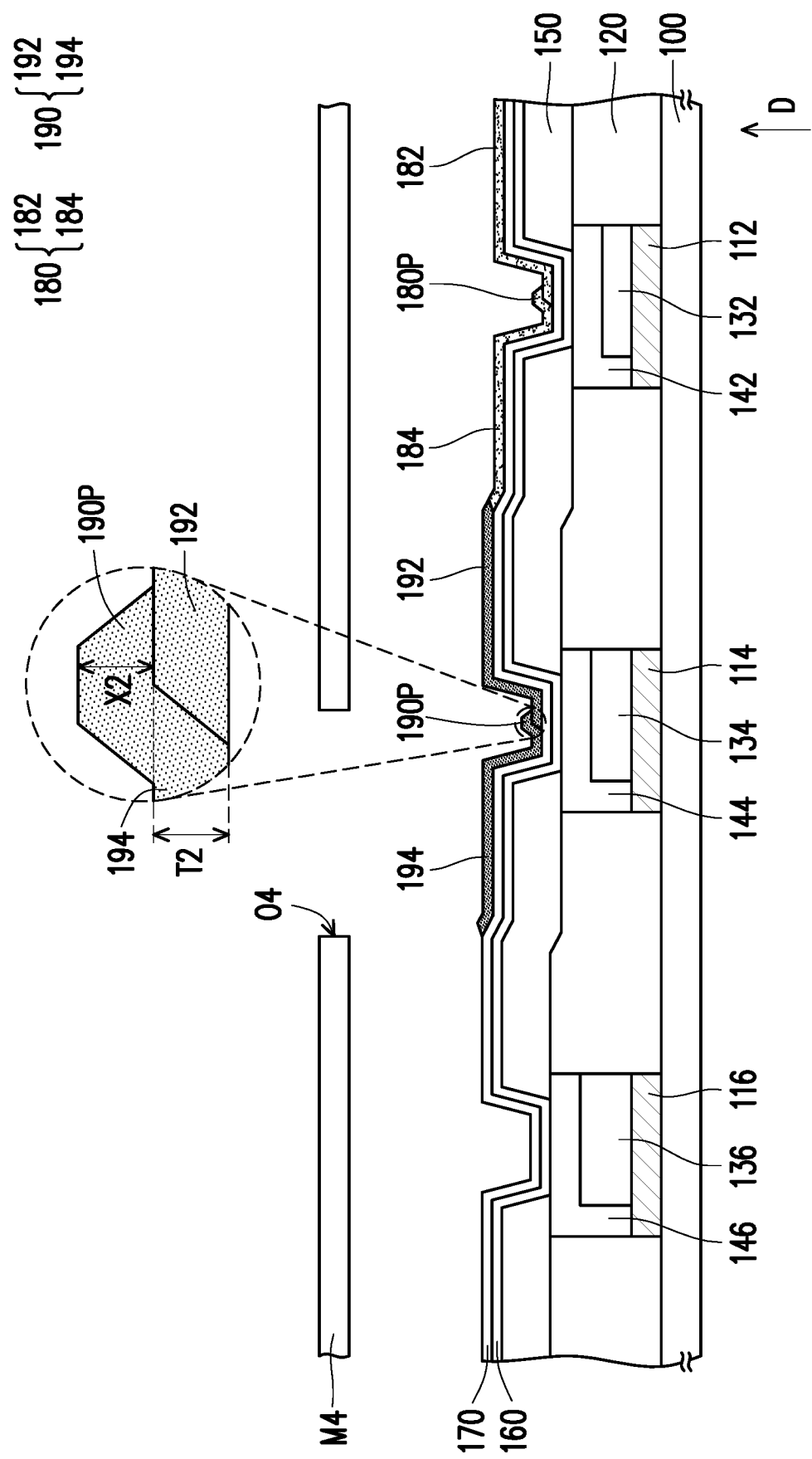
Figure 1K:
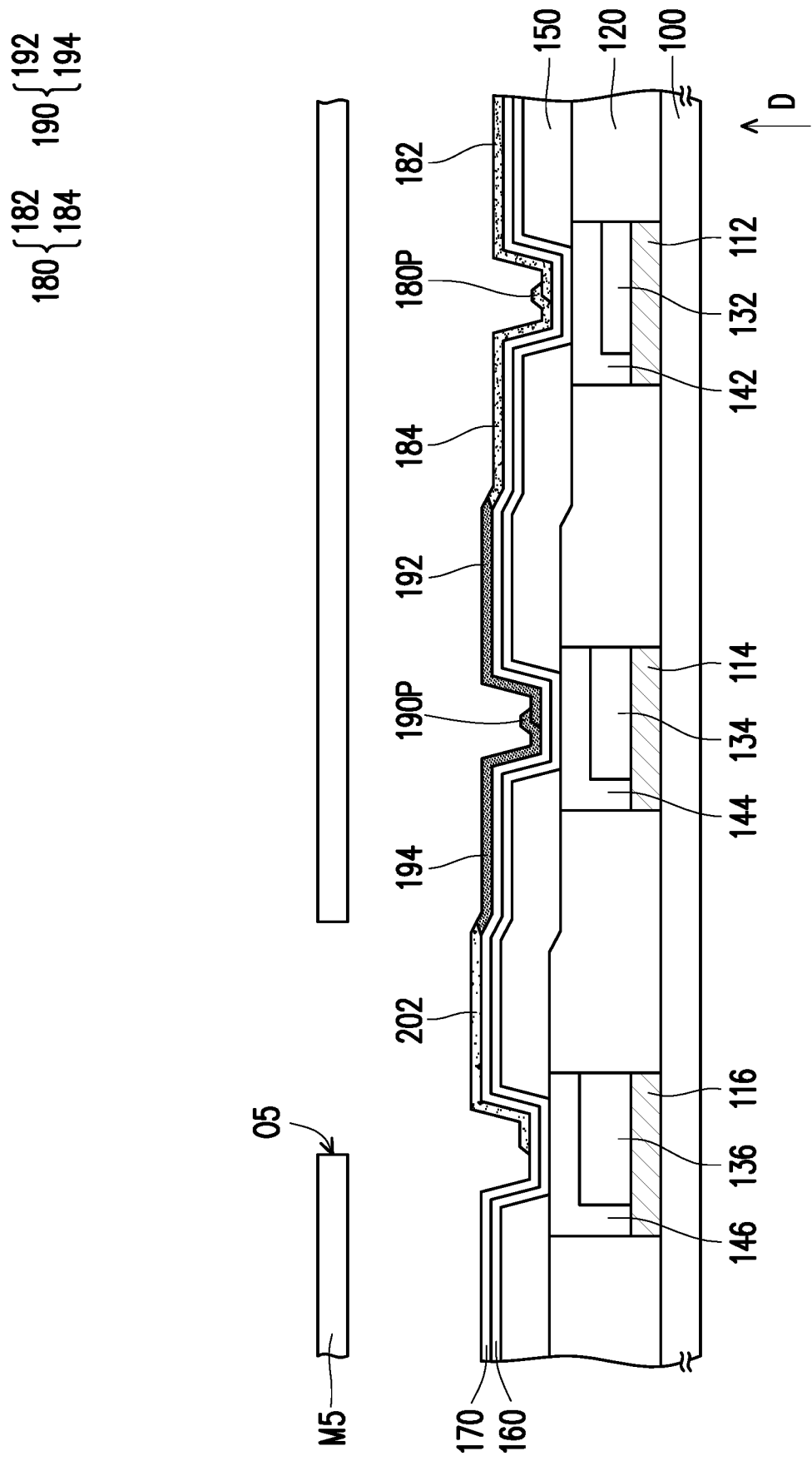
Figure 1L:
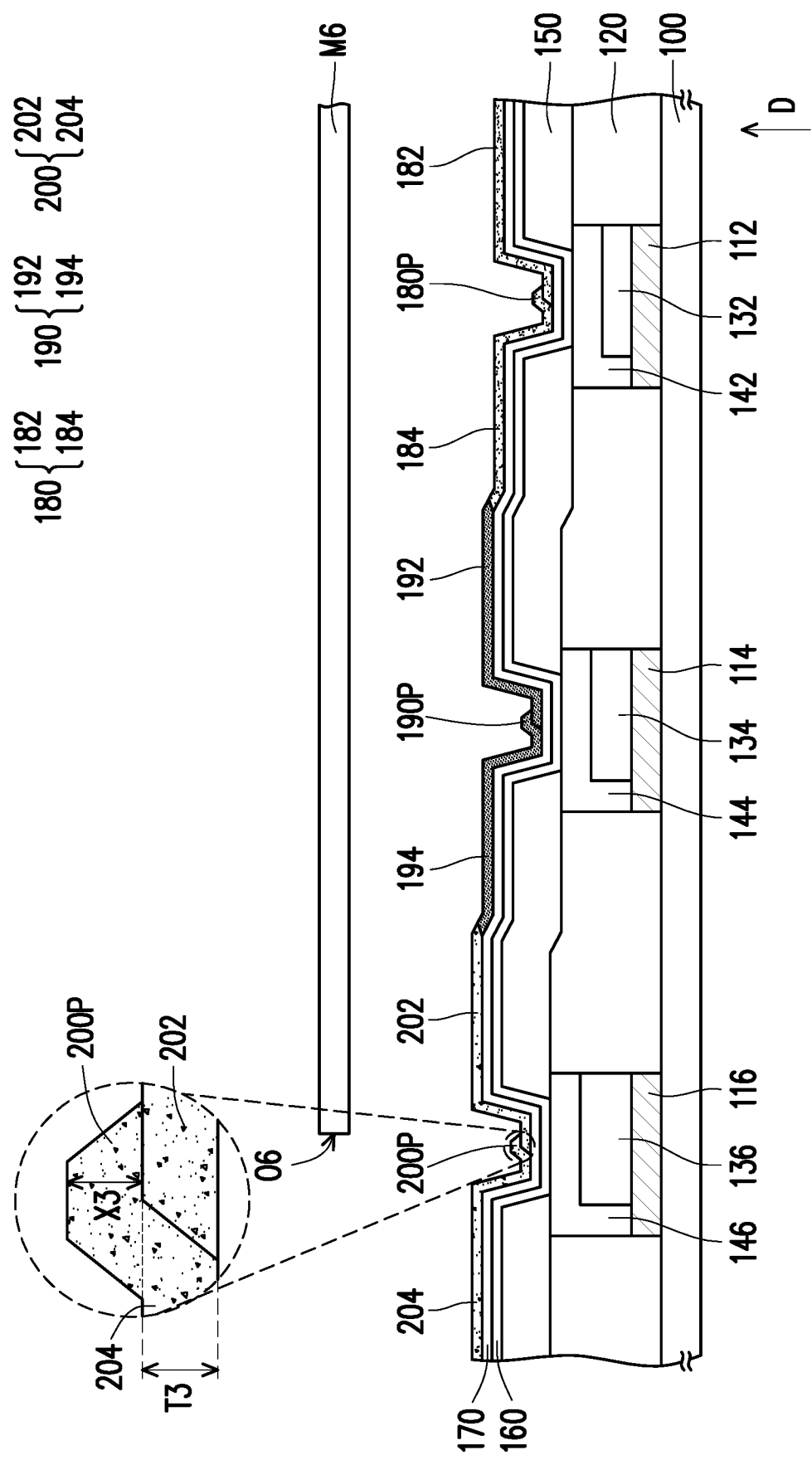
Figure 1M:
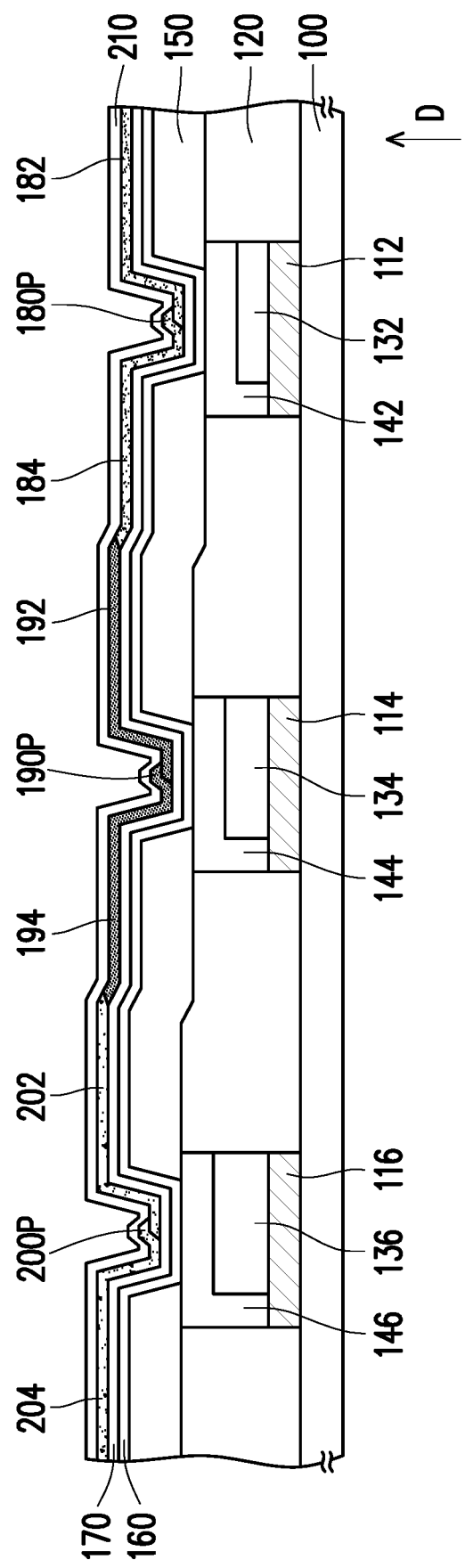
Figure 1N:
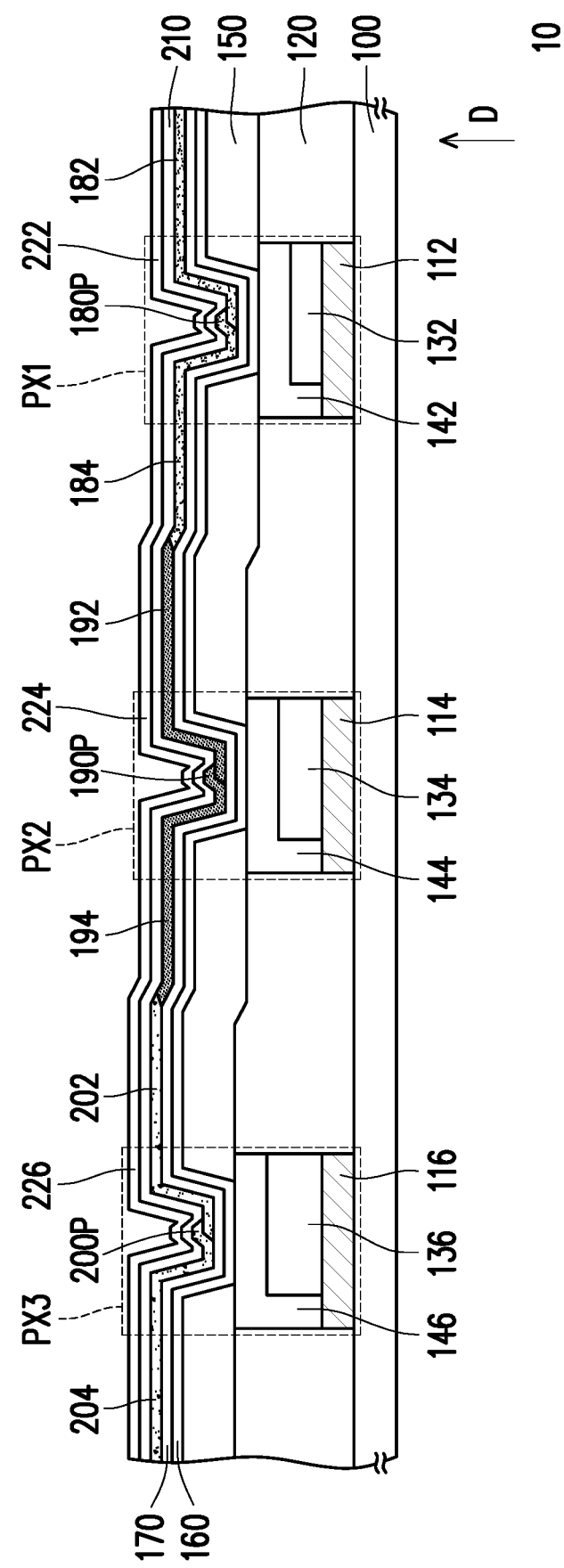

FIG. 1A to FIG. 1N are schematic cross-sectional views of a method for manufacturing a display apparatus according to an embodiment of the disclosure.

With reference to FIG. 1N, a method for manufacturing a display apparatus 10 includes: providing a substrate 100 and forming a first sub-pixel PX1 on a substrate 100. In the present embodiment, the method for manufacturing the display apparatus 10 further includes: forming a second sub-pixel PX2 and a third sub-pixel PX3 on the substrate 100.

With reference to FIG. 1A, a first reflecting layer 112, a second reflecting layer 114, and a third reflecting layer 116 are formed on the substrate 100. In the present embodiment, an insulation layer 120 is formed on the substrate 100, and the insulation layer 120 has an opening H1, an opening H2, and an opening H3. The first reflecting layer 112, the second reflecting layer 114, and the third reflecting layer 116 are respectively located in the opening H1, the opening H2, and the opening H3. In the present embodiment, the first reflecting layer 112, the second reflecting layer 114, and the third reflecting layer 116 are in a same conductive layer, but the disclosure is not limited thereto.

With reference to FIG. 1B, a first isolation layer 132 is formed on the first reflecting layer 112, the first reflecting layer 112 being located between the first isolation layer 132 and the substrate 100. The first isolation layer 132 has a first via TH1. A second isolation layer 134 is formed on the second reflecting layer 114, the second reflecting layer 114 being located between the second isolation layer 134 and the substrate 100. The second isolation layer 134 has a second via TH2. A third isolation layer 136 is formed on the third reflecting layer 116, the third reflecting layer 116 being located between the third isolation layer 136 and the substrate 100. The third isolation layer 136 has a third via TH3.

In the present embodiment, the method for forming the first via TH1, the second via TH2, and the third via TH3 includes etching, but the disclosure is not limited thereto.

In some embodiments, the first isolation layer 132, the second isolation layer 134, and the third isolation layer 136 are single-layer or multi-layer structures, and are made of silicon oxide, silicon nitride, silicon oxynitride, hafnium oxide, indium tin oxide, gallium zinc oxide, zinc oxide, indium zinc oxide, or a combination thereof.

In the present embodiment, a thickness W1 of the first isolation layer 132 is different from a thickness W2 of the second isolation layer 134 and a thickness W3 of the third isolation layer 136, and the thickness W2 of the second isolation layer 134 is different from the thickness W3 of the third isolation layer 136. In the present embodiment, the thickness W3 is greater than the thickness W2, and the thickness W2 is greater than the thickness W1. In the present embodiment, the thickness W3, the thickness W2, and the thickness W1 are 5 nanometers to 150 nanometers.

With reference to FIG. 1C, a first bottom electrode 142, a second bottom electrode 144, and a third bottom electrode 146 are formed on the substrate 100.

In the present embodiment, the first bottom electrode 142 is formed on the first isolation layer 132, the first bottom electrode 142 being electrically connected to the first reflecting layer 112 through the first via TH1 in the first isolation layer 132. The first isolation layer 132 is located between the first bottom electrode 142 and the substrate 100.

In the present embodiment, the second bottom electrode 144 is formed on the second isolation layer 134, the second bottom electrode 144 being electrically connected to the second reflecting layer 114 through the second via TH2 in the second isolation layer 134. The second isolation layer 134 is located between the second bottom electrode 144 and the substrate 100.

In the present embodiment, the third bottom electrode 146 is formed on the third isolation layer 136, the third bottom electrode 146 being electrically connected to the third reflecting layer 116 through the third via TH3 in the third isolation layer 136. The third isolation layer 136 is located between the third bottom electrode 146 and the substrate 100.

In the present embodiment, the first bottom electrode 142, the second bottom electrode 144, and the third bottom electrode 146 are simultaneously formed and are in a same conductive layer, but the disclosure is not limited thereto. The first bottom electrode 142, the second bottom electrode 144, and the third bottom electrode 146 are made of transparent conductive materials.

With reference to FIG. 1D, a pixel definition layer 150 is formed on the first bottom electrode 142, the second bottom electrode 144, the third bottom electrode 146, and the insulation layer 120. The pixel definition layer 150 has openings H4, H5, and H6, and the openings H4, H5, and H6 are respectively exposed from the first bottom electrode 142, the second bottom electrode 144, and the third bottom electrode 146.

With reference to FIG. 1E, a hole injection layer 160 is formed on the first bottom electrode 142, the second bottom electrode 144, the third bottom electrode 146, and the pixel definition layer 150. The hole injection layer 160 is electrically connected to the first bottom electrode 142, the second bottom electrode 144, and the third bottom electrode 146 respectively through the opening H4, the opening H5 and the opening H6.

With reference to FIG. 1F, a hole transport layer 170 is formed on the hole injection layer 160. In the present embodiment, a resonant cavity of a light-emitting diode is controlled by adjusting the thickness W1 of the first isolation layer 132, the thickness W2 of the second isolation layer 134, and the thickness W3 of the third isolation layer 136 instead of adjusting a thickness of the hole transport layer 170. Therefore, a fine metal mask is not required for forming the hole transport layer 170.

With reference to FIG. 1G, a first light-emitting material layer 182 is formed on the first bottom electrode 142 using a first mask M1 as a mask. The first mask M1 has a first opening O1 partially overlapping the first bottom electrode 142. In the present embodiment, a first light-emitting material layer 182 is formed on the hole transport layer 170. In the present embodiment, the first light-emitting material layer 182 partially overlapping the pixel definition layer 150.

With reference to FIG. 1H, a second light-emitting material layer 184 is formed on the first bottom electrode 142 using a second mask M2 as a mask. The second mask M2 has a second opening O2 partially overlapping the first bottom electrode 142. A location of the first bottom electrode 142 to which the first opening O1 (referring to FIG. 1G) corresponds is different from that of the first bottom electrode 142 to which the second opening O2 corresponds. In the present embodiment, a second light-emitting material layer 184 is formed on the hole transport layer 170. In the present embodiment, the second light-emitting material layer 184 partially overlapping the pixel definition layer 150.

The first light-emitting material layer 182 and the second light-emitting material layer 184 constitute a first light-emitting layer 180. The first light-emitting layer 180 has a first groove structure located between the first light-emitting material layer 182 and the second light-emitting material layer 184 or a first protrusion structure 180P located at an overlapping portion where the first light-emitting material layer 182 and the second light-emitting material layer 184 are overlapped. In the present embodiment, the first light-emitting layer 180 has the first protrusion structure 180P located at the overlapping portion where the first light-emitting material layer 182 and the second light-emitting material layer 184 are overlapped.

In the present embodiment, the first light-emitting layer 180 with the first protrusion structure 180P is formed using the first mask M1 and the second mask M2. Therefore, sizes of the first opening O1 on the first mask M1 and the second opening O2 on the second mask M2 may be reduced, and therefore the first light-emitting layer 180 does not easily overlap other bottom electrodes except the first bottom electrode 142 in a direction D perpendicular to the substrate 100.

In the present embodiment, a height X1 of the first protrusion structure 180P is 0.1 T1 to 1 T1, where T1 is a thickness of the first light-emitting layer 180 around the first protrusion structure 180P.

In the present embodiment, a method for forming the first light-emitting material layer 182 and the second light-emitting material layer 184 includes evaporation. The first light-emitting material layer 182 and the second light-emitting material layer 184 may be made of, for example, blue organic light-emitting materials.

With reference to FIG. 1I, a third light-emitting material layer 192 is formed on the second bottom electrode 144 using a third mask M3 as a mask. The third mask M3 has a third opening O3 partially overlapping the second bottom electrode 144. In the present embodiment, a third light-emitting material layer 192 is formed on the hole transport layer 170. In the present embodiment, the third light-emitting material layer 192 partially overlaps the pixel definition layer 150.

With reference to FIG. 1J, a fourth light-emitting material layer 194 is formed on the second bottom electrode 144 using a fourth mask M4 as a mask. The fourth mask M4 has a fourth opening O4 partially overlapping the second bottom electrode 144. A location of the second bottom electrode 144 to which the third opening O3 corresponds is different from that of the second bottom electrode 144 to which the fourth opening O4 corresponds. In the present embodiment, a fourth light-emitting material layer 194 is formed on the hole transport layer 170. In the present embodiment, the fourth light-emitting material layer 194 partially overlaps the pixel definition layer 150.

The third light-emitting material layer 192 and the fourth light-emitting material layer 194 constitute a second light-emitting layer 190. The second light-emitting layer 190 has a second groove structure located between the third light-emitting material layer 192 and the fourth light-emitting material layer 194 or a second protrusion structure 190P located at an overlapping portion where the third light-emitting material layer 192 and the fourth light-emitting material layer 194 are overlapped. In the present embodiment, the second light-emitting layer 190 has the second protrusion structure 190P located at the overlapping portion where the third light-emitting material layer 192 and the fourth light-emitting material layer 194 are overlapped.

In the present embodiment, the second light-emitting layer 190 with the second protrusion structure 190P is formed using the third mask M3 and the fourth mask M4. Therefore, sizes of the third opening O3 on the third mask M3 and the fourth opening O4 on the fourth mask M4 may be reduced, so that the second light-emitting layer 190 does not easily overlap other bottom electrodes except the second bottom electrode 144 in a direction D perpendicular to the substrate 100.

In the present embodiment, a height X2 of the second protrusion structure 190P is 0.1 T2 to 1 T2, where T2 is a thickness of the second light-emitting layer 190 around the second protrusion structure 190P.

In the present embodiment, a method for forming the third light-emitting material layer 192 and the fourth light-emitting material layer 194 includes evaporation. The third light-emitting material layer 192 and the fourth light-emitting material layer 194 may be made of, for example, green organic light-emitting materials.

With reference to FIG. 1K, a fifth light-emitting material layer 202 is formed on the third bottom electrode 146 using a fifth mask M5 as a mask. The fifth mask M5 has a fifth opening O5 partially overlapping the third bottom electrode 146. In the present embodiment, a fifth light-emitting material layer 202 is formed on the hole transport layer 170. In the present embodiment, the fifth light-emitting material layer 202 partially overlaps the pixel definition layer 150.

With reference to FIG. 1L, a sixth light-emitting material layer 204 is formed on the third bottom electrode 146 using a sixth mask M6 as a mask. The sixth mask M6 has a sixth opening O6 partially overlapping the third bottom electrode 146. A location of the third bottom electrode 146 to which the fifth opening O5 corresponds is different from that of the third bottom electrode 146 to which the sixth opening O6 corresponds. In the present embodiment, a sixth light-emitting material layer 204 is formed on the hole transport layer 170. In the present embodiment, the sixth light-emitting material layer 204 partially overlaps the pixel definition layer 150.

The fifth light-emitting material layer 202 and the sixth light-emitting material layer 204 constitute a third light-emitting layer 200. The third light-emitting layer 200 has a third groove structure located between the fifth light-emitting material layer 202 and the sixth light-emitting material layer 204 or a third protrusion structure 200P located at an overlapping portion where the fifth light-emitting material layer 202 and the sixth light-emitting material layer 204 are overlapped. In the present embodiment, the third light-emitting layer 200 has the third protrusion structure 200P located at the overlapping portion where the fifth light-emitting material layer 202 and the sixth light-emitting material layer 204 are overlapped.

In the present embodiment, a height X3 of the third protrusion structure 200P is 0.1 T3 to 1 T3, where T3 is a thickness of the third light-emitting layer 200 around the third protrusion structure 200P.

In the present embodiment, a method for forming the fifth light-emitting material layer 202 and the sixth light-emitting material layer 204 includes evaporation. The fifth light-emitting material layer 202 and the sixth light-emitting material layer 204 may be made of, for example, red organic light-emitting materials.

In the present embodiment, the first mask M1 to the sixth mask M6 are fine metal masks.

With reference to FIG. 1M, an electron transport layer 210 is formed on the first light-emitting layer 180 (the first light-emitting material layer 182 and the second light-emitting material layer 184), the second light-emitting layer 190 (the third light-emitting material layer 192 and the fourth light-emitting material layer 194), and the third light-emitting layer 200 (the fifth light-emitting material layer 202 and the sixth light-emitting material layer 204).

With reference to FIG. 1N, a first top electrode 222 is formed on the first light-emitting layer 180. A second top electrode 224 is formed on the second light-emitting layer 190. A third top electrode 226 is formed on the third light-emitting layer 200. In the present embodiment, the first top electrode 222, the second top electrode 224, and the third top electrode 226 are simultaneously formed, and the first top electrode 222, the second top electrode 224, and the third top electrode 226 are integrally formed. In the present embodiment, the first top electrode 222, the second top electrode 224, and the third top electrode 226 are formed on the electron transport layer 210. The first top electrode 222, the second top electrode 224, and the third top electrode 226 are made of transparent conductive materials or semi-transparent conductive materials.

Therefore, the first sub-pixel PX1, the second sub-pixel PX2, and the third sub-pixel PX3 of the display apparatus 10 are generally formed. In the present embodiment, the first sub-pixel PX1 includes at least a first reflecting layer 112, a first isolation layer 132, a first bottom electrode 142, a first light-emitting layer 180, and a first top electrode 222. In the present embodiment, the second sub-pixel PX2 includes: a second reflecting layer 114, a second isolation layer 134, a second bottom electrode 144, a second light-emitting layer 190, and a second top electrode 224. In the present embodiment, the third sub-pixel PX3 includes: a third reflecting layer 116, a third isolation layer 136, a third bottom electrode 146, a third light-emitting layer 200, and a third top electrode 226.

The first bottom electrode 142 of the first sub-pixel PX1, the second bottom electrode 144 of the second sub-pixel PX2, and the third bottom electrode 146 of the third sub-pixel PX3 are respectively connected to different switch elements (not drawn), and these switch elements, for example, are located between the substrate 100 and the insulation layer 120, but the disclosure is not limited thereto.

In the present embodiment, a resolution of the display apparatus 10 is, for example, 400 ppi to 3000 ppi.

Based on the foregoing, a resonant cavity of a light-emitting diode is controlled by adjusting the thickness W1 of the first isolation layer 132, the thickness W2 of the second isolation layer 134, and the thickness W3 of the third isolation layer 136 instead of adjusting a thickness of the hole transport layer 170. Therefore, the display apparatus 10 does not cause a problem of color unevenness because of inaccurate alignment of the hole transport layer 170. In the present embodiment, a light-emitting layer with a groove structure or a protrusion structure is formed via two fine metal mask processes, and therefore a single light-emitting layer does not easily overlap two bottom electrodes at the same time in a direction perpendicular to a substrate, thereby improving a color mixing problem of the display apparatus.

FIG. 2A to FIG. 2G are schematic cross-sectional views of a display apparatus according to an embodiment of the disclosure. It needs to be noted herein that element numerals and some content in the embodiments of FIG. 2A to FIG. 2G are the same as that in the embodiments of FIG. 1A to FIG. 1N, and same or similar numerals are used to represent same or similar elements, and descriptions about same technical content are omitted. For the description of the omitted part, reference may be made to the foregoing embodiments, and the descriptions thereof are omitted herein.

Figure 2A:
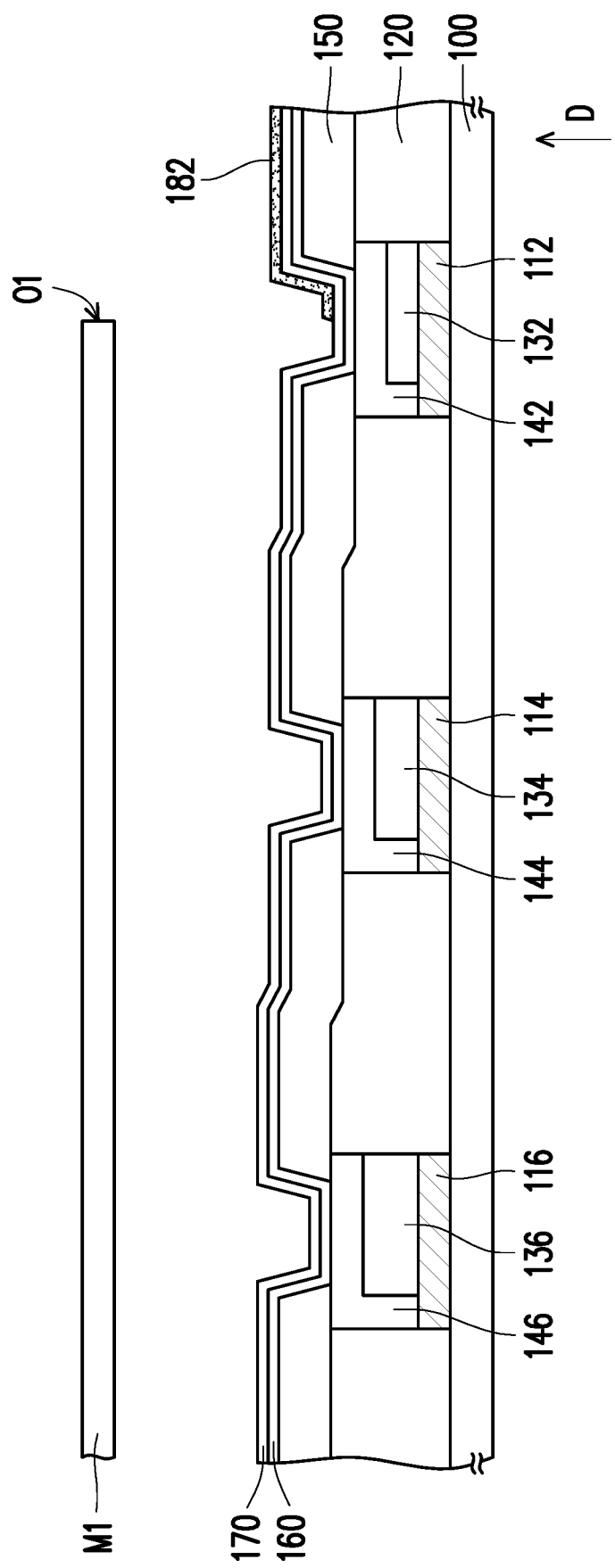
FIG. 2A to FIG. 2G are schematic cross-sectional views of a method for manufacturing a display apparatus according to an embodiment of the disclosure.
Figure 2B:
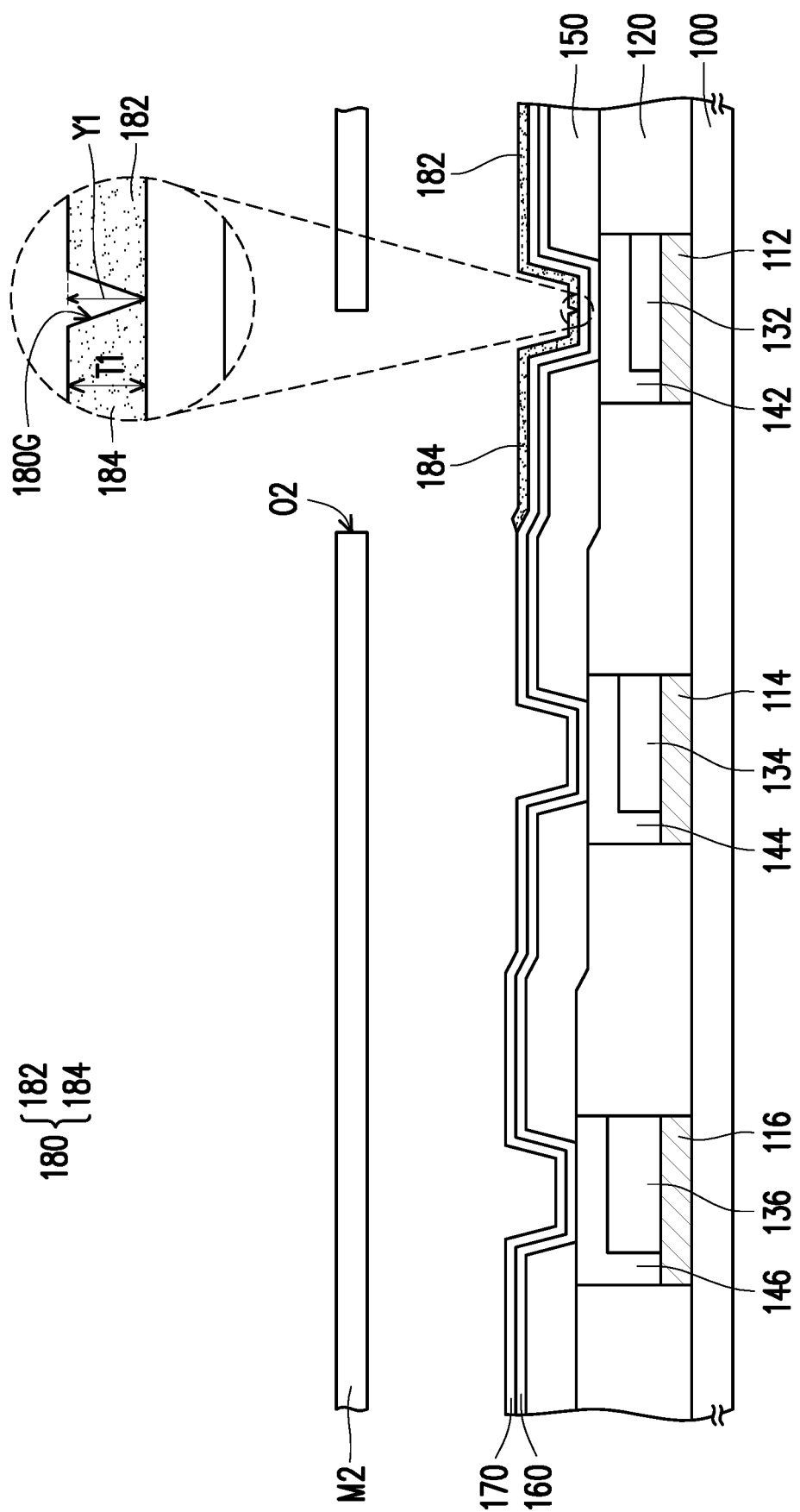
Figure 2C:
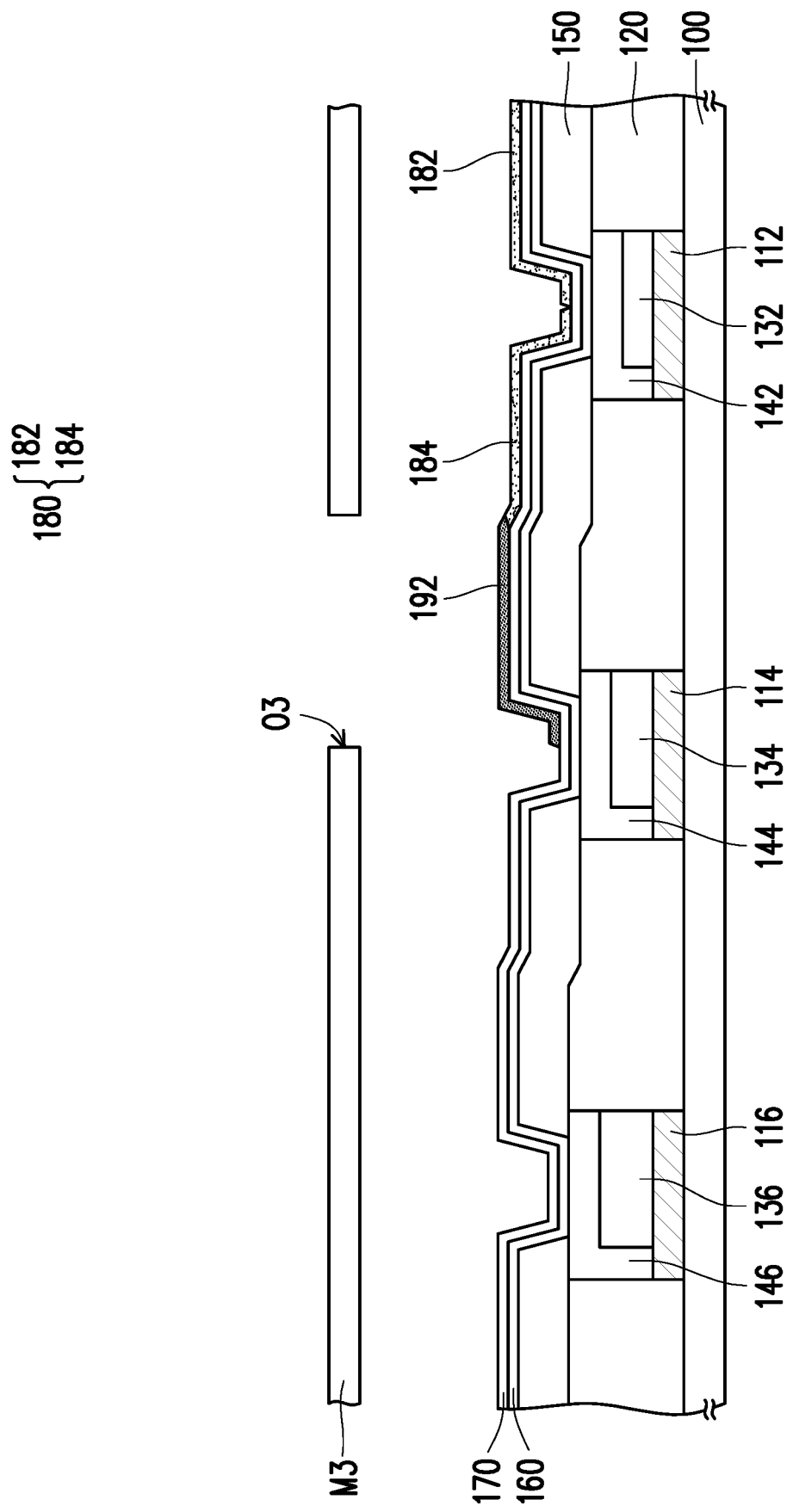
Figure 2D:
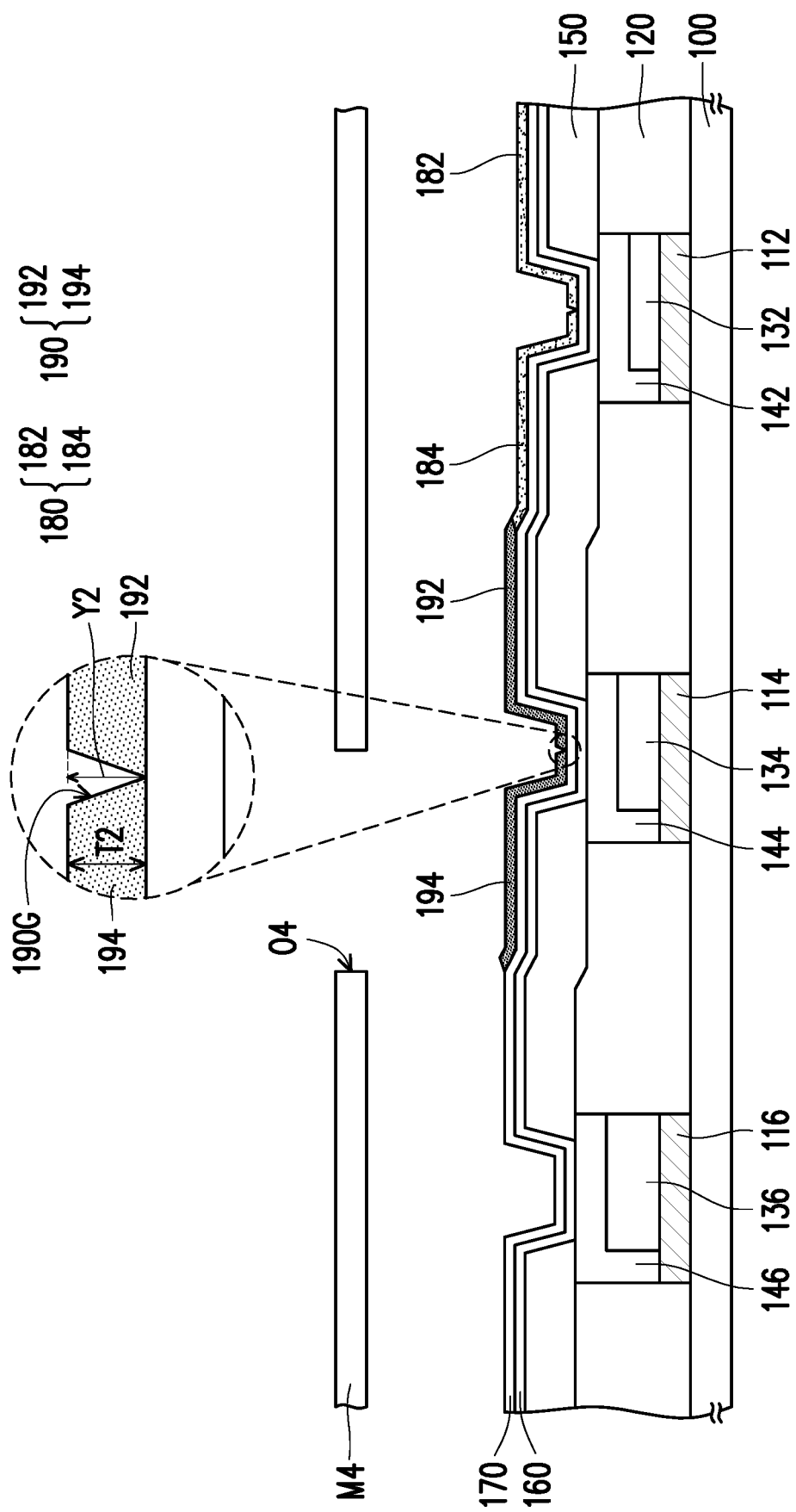
Figure 2E:
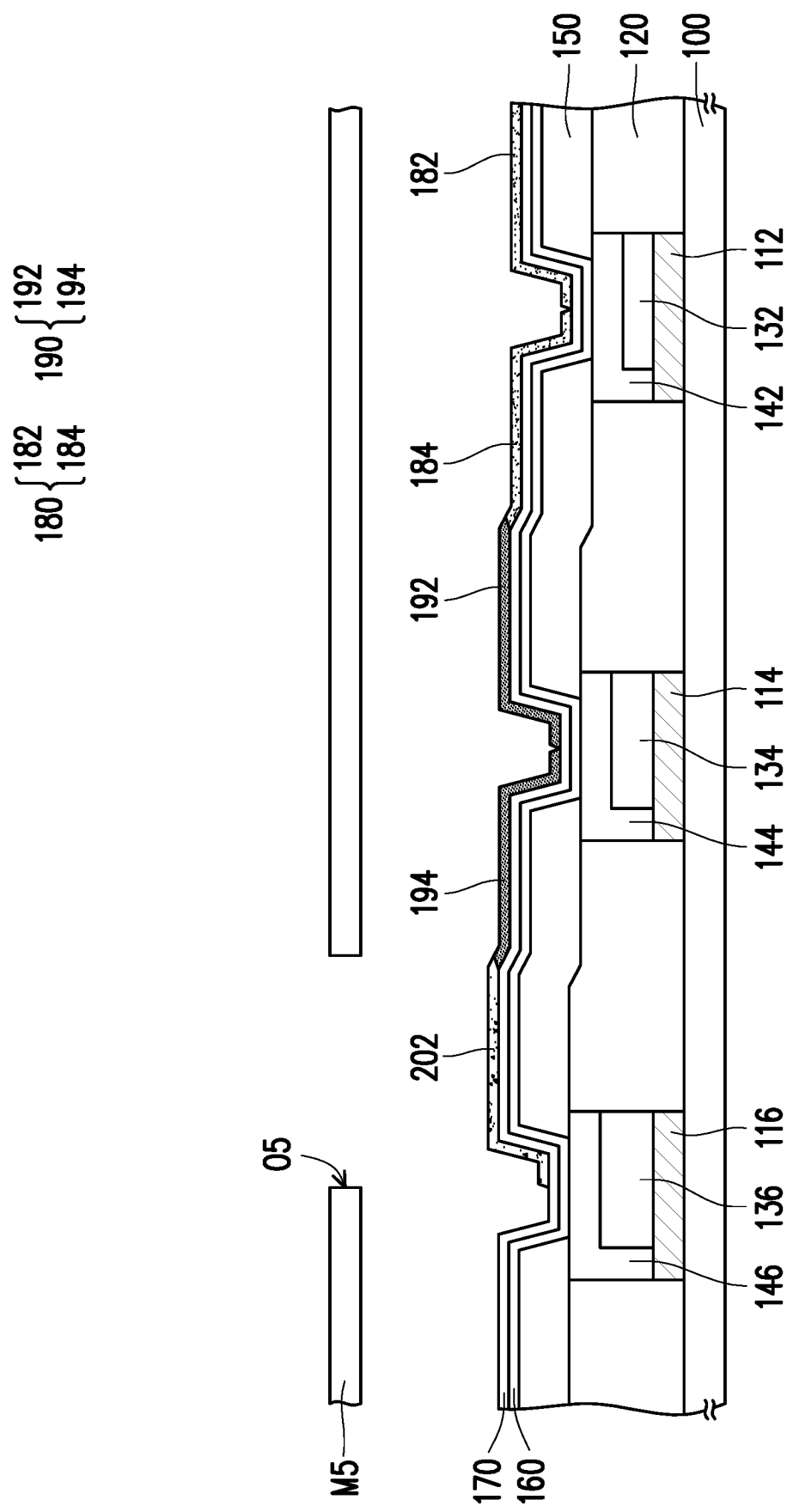
Figure 2F:
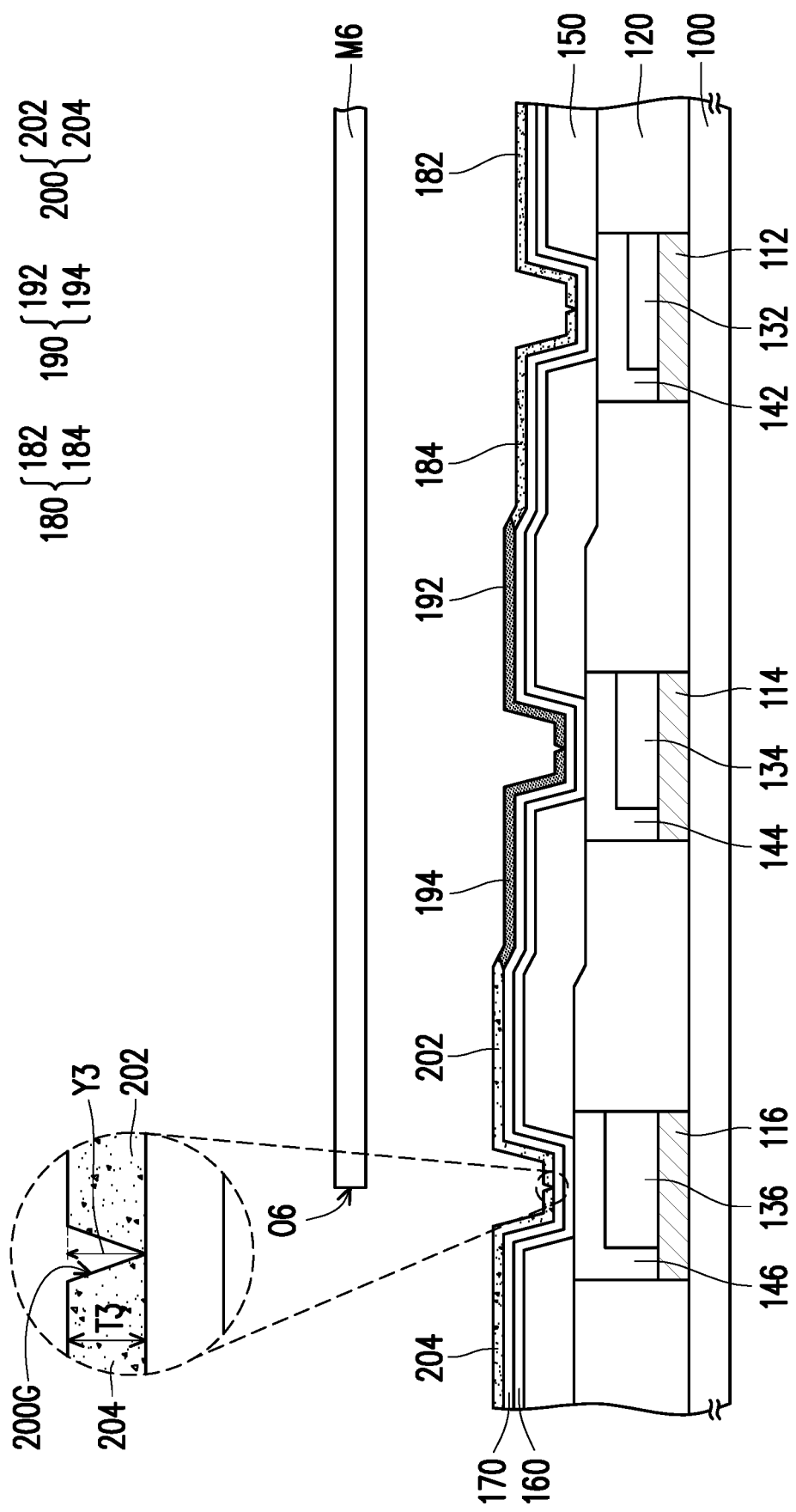
Figure 2G:
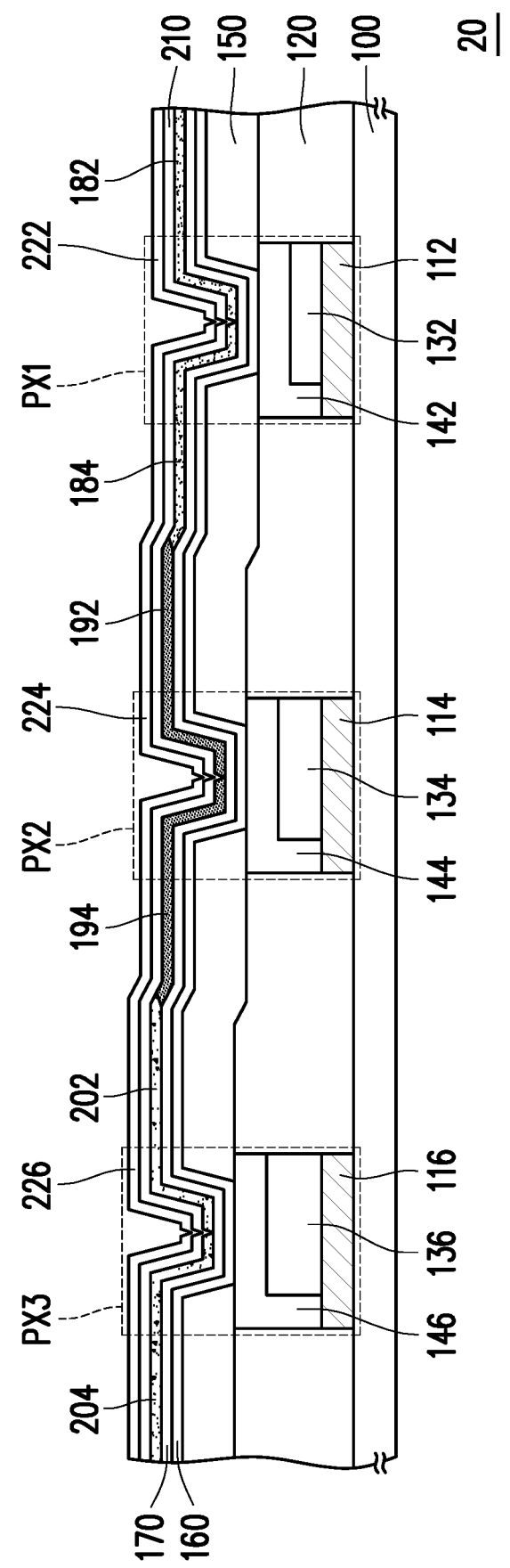

A main difference between the display apparatus 20 of FIG. 2G and the display apparatus 10 of FIG. 1N is that in the display apparatus 20, a first light-emitting layer 180 has a first groove structure 180G, a second light-emitting layer 190 has a second groove structure 190G, and a third light-emitting layer 200 has a third groove structure 200G.

With reference to FIG. 2A, a first light-emitting material layer 182 is formed on a first bottom electrode 142 using a first mask M1 as a mask. The first mask M1 has a first opening O1 partially overlapping the first bottom electrode 142. In the present embodiment, a first light-emitting material layer 182 is formed on a hole transport layer 170.

With reference to FIG. 2B, a second light-emitting material layer 184 is formed on the first bottom electrode 142 using a second mask M2 as a mask. The second mask M2 has a second opening O2 partially overlapping the first bottom electrode 142. A location of the first bottom electrode 142 to which the first opening O1 corresponds is different from that of the first bottom electrode 142 to which the second opening O2 corresponds. In the present embodiment, the second light-emitting material layer 184 is formed on the hole transport layer 170.

The first light-emitting material layer 182 and the second light-emitting material layer 184 constitute the first light-emitting layer 180. The first light-emitting layer 180 has the first groove structure 180G located between the first light-emitting material layer 182 and the second light-emitting material layer 184.

In the present embodiment, the first light-emitting layer 180 having the first groove structure 180G is formed using the first mask M1 and the second mask M2. Therefore, sizes of the first opening O1 on the first mask M1 and the second opening O2 on the second mask M2 may be reduced, so that the first light-emitting layer 180 does not easily overlap other bottom electrodes except the first bottom electrode 142 in a direction D perpendicular to the substrate 100.

In the present embodiment, a depth Y1 of the first groove structure 180G is 0.1 T1 to 1 T1, where T1 is a thickness of the first light-emitting layer 180 around the first groove structure 180G. The first light-emitting material layer 182 and the second light-emitting material layer 184 may be in contact with each other or separated from each other.

In the present embodiment, a method for forming the first light-emitting material layer 182 and the second light-emitting material layer 184 includes evaporation. The first light-emitting material layer 182 and the second light-emitting material layer 184 may be made of, for example, blue organic light-emitting materials.

With reference to FIG. 2C, a third light-emitting material layer 192 is formed on the second bottom electrode 144 using a third mask M3 as a mask. The third mask M3 has a third opening O3 partially overlapping the second bottom electrode 144. In the present embodiment, a third light-emitting material layer 192 is formed on the hole transport layer 170.

With reference to FIG. 2D, a fourth light-emitting material layer 194 is formed on the second bottom electrode 144 using a fourth mask M4 as a mask. The fourth mask M4 has a fourth opening O4 partially overlapping the second bottom electrode 144. A location of the second bottom electrode 144 to which the third opening O3 corresponds is different from that of the second bottom electrode 144 to which the fourth opening O4 corresponds. In the present embodiment, a fourth light-emitting material layer 194 is formed on the hole transport layer 170.

The third light-emitting material layer 192 and the fourth light-emitting material layer 194 constitute the second light-emitting layer 190. The second light-emitting layer 190 has the second groove structure 190G located between the third light-emitting material layer 192 and the fourth light-emitting material layer 194.

In the present embodiment, the second light-emitting layer 190 having the second groove structure 190G is formed using the third mask M3 and the fourth mask M4. Therefore, sizes of the third opening O3 on the third mask M3 and the fourth opening O4 on the fourth mask M4 may be reduced, so that the second light-emitting layer 190 does not easily overlap other bottom electrodes except the second bottom electrode 144 in a direction D perpendicular to the substrate 100.

In the present embodiment, a depth Y2 of the second groove structure 190G is 0.1 T2 to 1 T2, where T2 is a thickness of the second light-emitting layer 190 around the second groove structure 190G. The third light-emitting material layer 192 and the fourth light-emitting material layer 194 may be in contact with each other or separated from each other.

In the present embodiment, a method for forming the third light-emitting material layer 192 and the fourth light-emitting material layer 194 includes evaporation. The third light-emitting material layer 192 and the fourth light-emitting material layer 194 may be made of, for example, green organic light-emitting materials.

With reference to FIG. 2E, a fifth light-emitting material layer 202 is formed on the third bottom electrode 146 using a fifth mask M5 as a mask. The fifth mask M5 has a fifth opening O5 partially overlapping the third bottom electrode 146. In the present embodiment, the fifth light-emitting material layer 202 is formed on a hole transport layer 170.

With reference to FIG. 2F, a sixth light-emitting material layer 204 is formed on the third bottom electrode 146 using a sixth mask M6 as a mask. The sixth mask M6 has a sixth opening O6 partially overlapping the third bottom electrode 146. A location of the third bottom electrode 146 to which the fifth opening O5 corresponds is different from that of the third bottom electrode 146 to which the sixth opening O6 corresponds. In the present embodiment, a sixth light-emitting material layer 204 is formed on the hole transport layer 170.

The fifth light-emitting material layer 202 and the sixth light-emitting material layer 204 constitute a third light-emitting layer 200. The third light-emitting layer 200 has the third groove structure 200G located between the fifth light-emitting material layer 202 and the sixth light-emitting material layer 204.

In the present embodiment, the third light-emitting layer 200 having the third groove structure 200G is formed using the fifth mask M5 and the sixth mask M6. Therefore, sizes of the fifth opening O5 on the fifth mask M5 and the sixth opening O6 on the sixth mask M6 may be reduced, so that the third light-emitting layer 200 does not easily overlap other bottom electrodes except the third bottom electrode 146 in a direction D perpendicular to the substrate 100.

In the present embodiment, a depth Y3 of the third groove structure 200G is 0.1 T3 to 1 T3, where T3 is a thickness of the third light-emitting layer 200 around the third groove structure 200G. The fifth light-emitting material layer 202 and the sixth light-emitting material layer 204 may be in contact with each other or separated from each other.

In the present embodiment, a method for forming the fifth light-emitting material layer 202 and the sixth light-emitting material layer 204 includes evaporation. The fifth light-emitting material layer 202 and the sixth light-emitting material layer 204 may be made of, for example, red organic light-emitting materials.

In the present embodiment, the first mask M1 to the sixth mask M6 are fine metal masks.

With reference to FIG. 2G, an electron transport layer 210 is formed on the first light-emitting layer 180, the second light-emitting layer 190, and the third light-emitting layer 200. The first top electrode 222, the second top electrode 224, and the third top electrode 226 are formed on the electron transport layer 210.

Therefore, a first sub-pixel PX1, a second sub-pixel PX2, and a third sub-pixel PX3 of a display apparatus 20 are generally formed.

In the present embodiment, a resolution of the display apparatus 20 is, for example, 400 ppi to 3000 ppi.

Based on the foregoing, a resonant cavity of a light-emitting diode is controlled by adjusting a thickness W1 of a first isolation layer 132, a thickness W2 of a second isolation layer 134, and a thickness W3 of a third isolation layer 136 instead of adjusting a thickness of the hole transport layer 170. Therefore, the display apparatus 20 does not cause a problem of color unevenness because of inaccurate alignment of the hole transport layer 170. In the present embodiment, a light-emitting layer with a groove structure or a protrusion structure is formed via two fine metal mask processes, and therefore a single light-emitting layer does not easily overlap two bottom electrodes at the same time in a direction perpendicular to a substrate, thereby improving a color mixing problem of the display apparatus.

Figure 3:
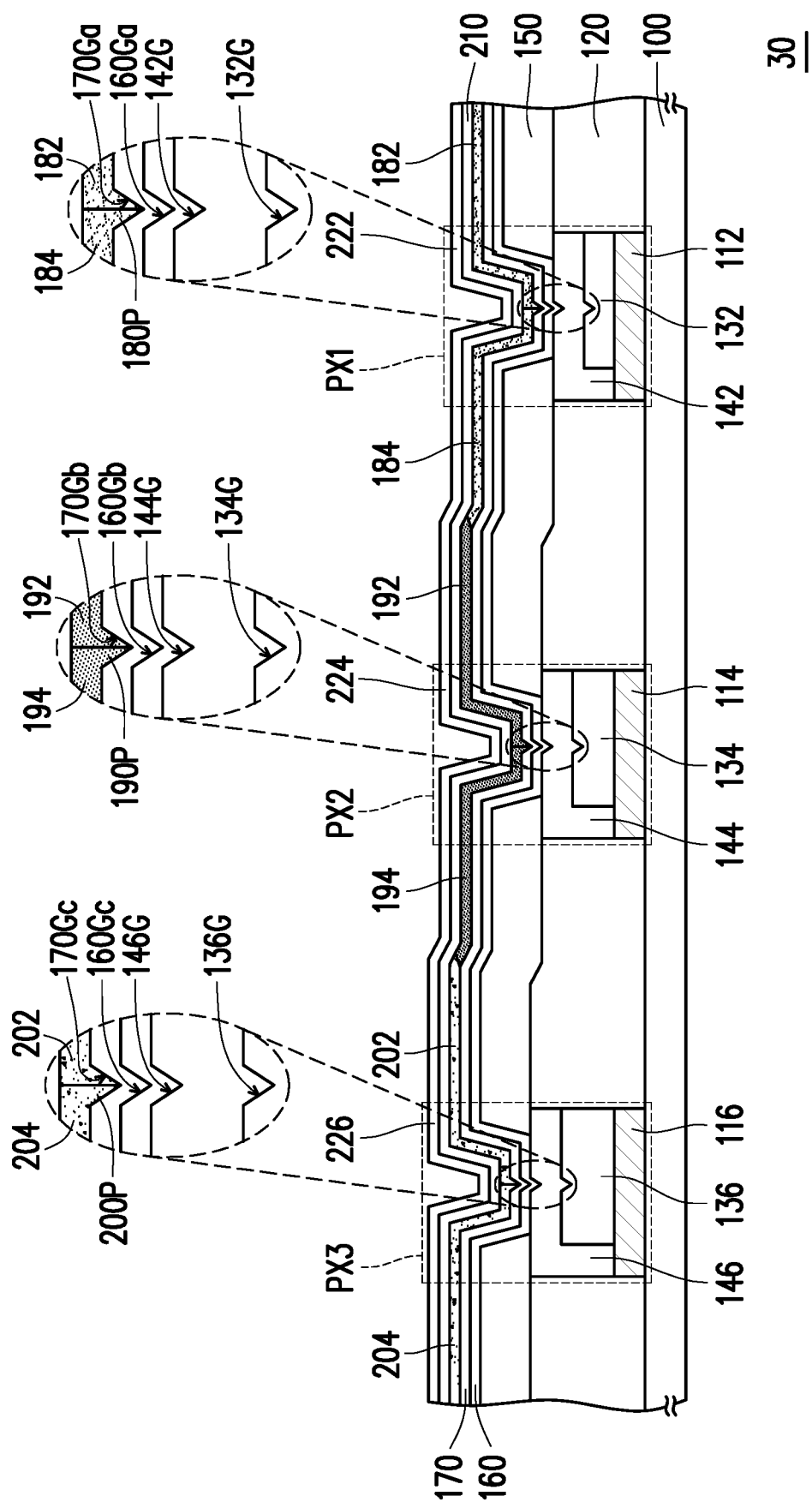
FIG. 3 is a schematic cross-sectional view of a display apparatus according to an embodiment of the disclosure.

FIG. 3 is a schematic cross-sectional view of a display apparatus according to an embodiment of the disclosure. It needs to be noted herein that element numerals and some content in the embodiments of FIG. 3 are the same as that in the embodiments of FIG. 1A to FIG. 1N, and same or similar numerals are used to represent same or similar elements, and descriptions about same technical content are omitted. For the description of the omitted part, reference may be made to the foregoing embodiments, and the descriptions thereof are omitted herein.

A main difference between the display apparatus 30 of FIG. 3 and the display apparatus 10 of FIG. 1N is that in the display apparatus 30, a first isolation layer 132 has a first auxiliary groove structure 132G whose location corresponds to a first protrusion structure 180P, a second isolation layer 134 has a second auxiliary groove structure 134G whose location corresponds to a second protrusion structure 190P, and a third isolation layer 136 has a third auxiliary groove structure 136G whose location corresponds to a third protrusion structure 200P.

With reference to FIG. 3, the first isolation layer 132 has the first auxiliary groove structure 132G. A first bottom electrode 142 is conformal with the first auxiliary groove structure 132G, and therefore the first bottom electrode 142 has a recess 142G corresponding to the first auxiliary groove structure 132G. A hole injection layer 160 is conformal with the recess 142G of the first bottom electrode 142 corresponding to the first auxiliary groove structure 132G, and therefore the hole injection layer 160 has a recess 160Ga corresponding to the first auxiliary groove structure 132G. A hole transport layer 170 is conformal with the recess 160Ga that has the hole injection layer 160 and that corresponds to the first auxiliary groove structure 132G, and therefore the hole transport layer 170 has a recess 170Ga corresponding to the first auxiliary groove structure 132G. A first light-emitting layer 180 is conformal with the recess 170Ga that has the hole transport layer 170 and that corresponds to the first auxiliary groove structure 132G, and therefore the first light-emitting layer 180 is filled into the recess 170Ga that has the hole transport layer 170 and that corresponds to the first auxiliary groove structure 132G. In the present embodiment, a location of the first auxiliary groove structure 132G corresponds to a first protrusion structure 180P of the first light-emitting layer 180, and therefore the first protrusion structure 180P is filled into the recess 170Ga that has the hole transport layer 170 and that corresponds to the first auxiliary groove structure 132G. In the present embodiment, the first protrusion structure 180P protrudes toward the substrate 100 from the first light-emitting layer 180.

The second isolation layer 134 has the second auxiliary groove structure 134G. A second bottom electrode 144 is conformal with the second auxiliary groove structure 134G, and therefore the second bottom electrode 144 has a recess 144G corresponding to the second auxiliary groove structure 134G. The hole injection layer 160 is conformal with the recess 144G that has the second bottom electrode 144 and that corresponds to the second auxiliary groove structure 134G, and therefore the hole injection layer 160 has a recess 160Gb corresponding to the second auxiliary groove structure 134G. A hole transport layer 170 is conformal with the recess 160Gb that has the hole injection layer 160 and that corresponds to the second auxiliary groove structure 134G, and therefore the hole transport layer 170 has a recess 170Gb corresponding to the second auxiliary groove structure 134G. A second light-emitting layer 190 is conformal with the recess 170Gb that has the hole transport layer 170 and that corresponds to the second auxiliary groove structure 134G, and therefore the second light-emitting layer 190 is filled into the recess 170Gb that has the hole transport layer 170 and that corresponds to the second auxiliary groove structure 134G. In the present embodiment, a location of the second auxiliary groove structure 134G corresponds to a second protrusion structure 190P of the second light-emitting layer 190, and therefore the second protrusion structure 190P is filled into the recess 170Gb that has the hole transport layer 170 and that corresponds to the second auxiliary groove structure 134G. In the present embodiment, the second protrusion structure 190P protrudes toward the substrate 100 from the second light-emitting layer 190.

A third isolation layer 136 has a third auxiliary groove structure 136G. A third bottom electrode 146 is conformal with the third auxiliary groove structure 136G, and therefore the third bottom electrode 146 has a recess 146G corresponding to the third auxiliary groove structure 136G. A hole injection layer 160 is conformal with the recess 146G that has the third bottom electrode 146 and that corresponds to the third auxiliary groove structure 136G, and therefore the hole injection layer 160 has a recess 160Gc corresponding to the third auxiliary groove structure 136G. A hole transport layer 170 is conformal with the recess 160Gc that has the hole injection layer 160 and that corresponds to the third auxiliary groove structure 136G, and therefore the hole transport layer 170 has a recess 170Gc corresponding to the third auxiliary groove structure 136G. A third light-emitting layer 200 is conformal with the recess 170Gc that has the hole transport layer 170 and that corresponds to the third auxiliary groove structure 136G, and therefore the third light-emitting layer 200 is filled into the recess 170Gc that has the hole transport layer 170 and that corresponds to the third auxiliary groove structure 136G. In the present embodiment, a location of the third auxiliary groove structure 136G corresponds to a third protrusion structure 200P of the third light-emitting layer 200, and therefore the third protrusion structure 200P is filled into the recess 170Gc that has the hole transport layer 170 and that corresponds to the third auxiliary groove structure 136G. In the present embodiment, the third protrusion structure 200P protrudes toward the substrate 100 from the third light-emitting layer 200.

Based on the foregoing, locations of the first protrusion structure 180P, the second protrusion structure 190P, and the third protrusion structure 200P correspond to the first auxiliary groove structure 132G, the second auxiliary groove structure 134G, and the third auxiliary groove structure 136G, and therefore a first top electrode 222, a second top electrode 224, and a third top electrode 226 formed on the first light-emitting layer 180, the second light-emitting layer 190, and the third light-emitting layer 200 may be relatively even.

Figure 4:
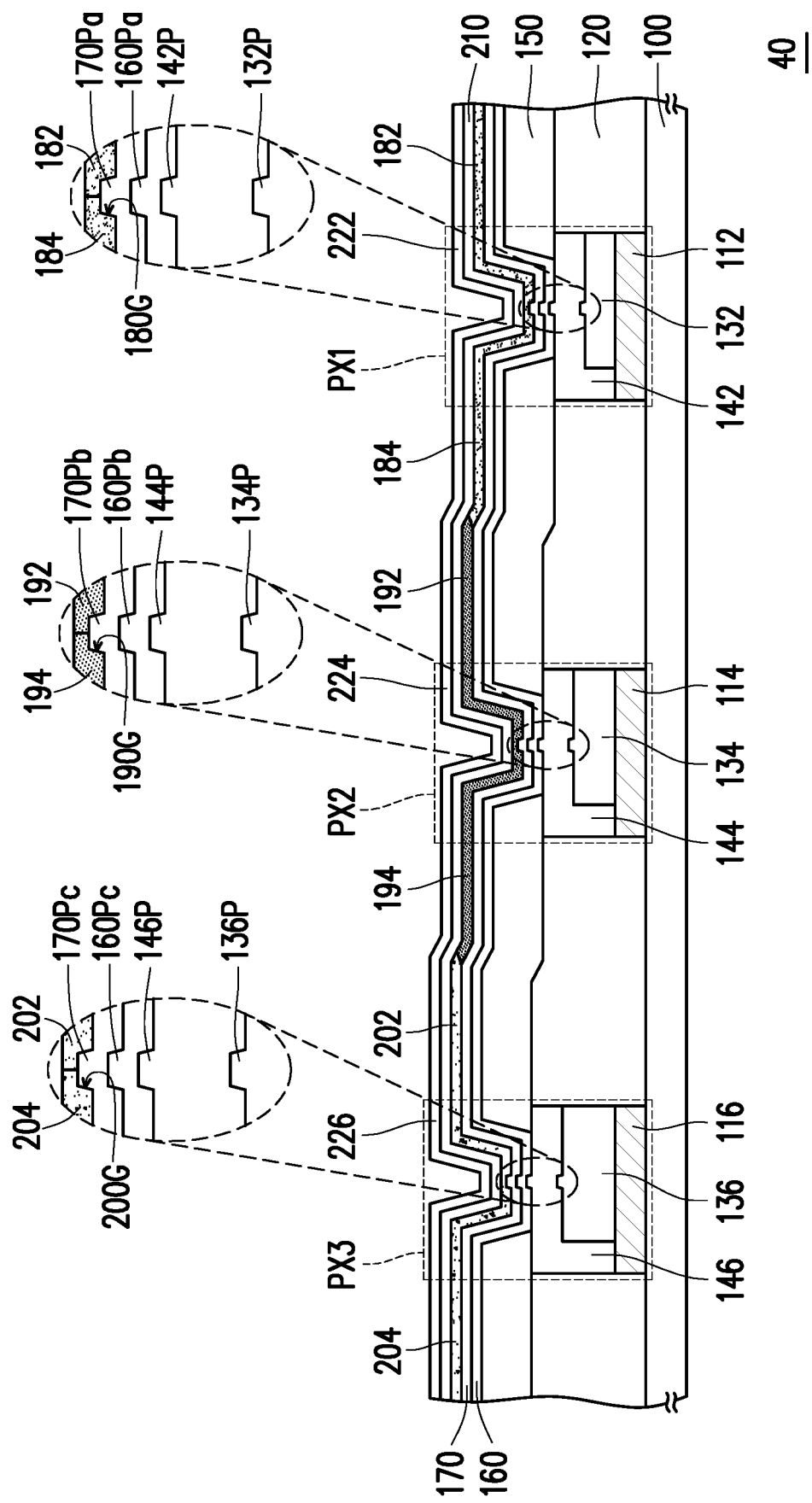
FIG. 4 is a schematic cross-sectional view of a display apparatus according to an embodiment of the disclosure.

FIG. 4 is a schematic cross-sectional view of a display apparatus according to an embodiment of the disclosure. It needs to be noted herein that element numerals and some content in the embodiments of FIG. 4 are the same as that in the embodiments of FIG. 2A to FIG. 2G, and same or similar numerals are used to represent same or similar elements, and descriptions about same technical content are omitted. For the description of the omitted part, reference may be made to the foregoing embodiments, and the descriptions thereof are omitted herein.

A main difference between the display apparatus 40 of FIG. 4 and the display apparatus 20 of the embodiments of FIG. 2A to FIG. 2G is that in the display apparatus 40, a first isolation layer 132 has a first auxiliary protrusion structure 132P whose location corresponds to a first groove structure 180G, a second isolation layer 134 has a second auxiliary protrusion structure 134P whose location corresponds to a second groove structure 190G, and a third isolation layer 136 has a third auxiliary protrusion structure 136P whose location corresponds to a third groove structure 200G.

With reference to FIG. 4, the first isolation layer 132 has the first auxiliary protrusion structure 132P. A first bottom electrode 142 is conformal with a first auxiliary protrusion structure 132P, and therefore the first bottom electrode 142 has a protrusion 142P corresponding to the first auxiliary protrusion structure 132P. A hole injection layer 160 is conformal with the protrusion 142P that has the first bottom electrode 142 and that corresponds to the first auxiliary protrusion structure 132P, and therefore the hole injection layer 160 has a protrusion 160Pa corresponding to the first auxiliary protrusion structure 132P. A hole transport layer 170 is conformal with the protrusion 160Pa that has the hole injection layer 160 and that corresponds to the first auxiliary protrusion structure 132P, and therefore the hole transport layer 170 has a protrusion 170Pa corresponding to the first auxiliary protrusion structure 132P. A first light-emitting layer 180 is conformal with the protrusion 170Pa that has the hole transport layer 170 and that corresponds to the first auxiliary protrusion structure 132P, and therefore the first light-emitting layer 180 covers the protrusion 170Pa that has the hole transport layer 170 and that corresponds to the first auxiliary protrusion structure 132P. In the present embodiment, a location of the first auxiliary protrusion structure 132P corresponds to a first groove structure 180G of the first light-emitting layer 180, and therefore the first groove structure 180G covers the protrusion 170Pa that has the hole transport layer 170 and that corresponds to the first auxiliary protrusion structure 132P. In the present embodiment, the first groove structure 180G faces the substrate 100.

A second isolation layer 134 has a second auxiliary protrusion structure 134P. A second bottom electrode 144 is conformal with the second auxiliary protrusion structure 134P, and therefore the second bottom electrode 144 has a protrusion 144P corresponding to the second auxiliary protrusion structure 134P. A hole injection layer 160 is conformal with the protrusion 144P that has the second bottom electrode 144 and that corresponds to the second auxiliary protrusion structure 134P, and therefore the hole injection layer 160 has a protrusion 160Pb corresponding to the second auxiliary protrusion structure 134P. A hole transport layer 170 is conformal with the protrusion 160Pb that has the hole injection layer 160 and that corresponds to the second auxiliary protrusion structure 134P, and therefore the hole transport layer 170 has a protrusion 170Pb corresponding to the second auxiliary protrusion structure 134P. A second light-emitting layer 190 is conformal with the protrusion 170Pb that has the hole transport layer 170 and that corresponds to the second auxiliary protrusion structure 134P, and therefore the second light-emitting layer 190 covers the protrusion 170Pb that has the hole transport layer 170 and that corresponds to the second auxiliary protrusion structure 134P. In the present embodiment, a location of the second auxiliary protrusion structure 134P corresponds to a second groove structure 190G of the second light-emitting layer 190, and therefore the second groove structure 190G covers the protrusion 170Pb that has the hole transport layer 170 and that corresponds to the second auxiliary groove structure 134P. In the present embodiment, the second groove structure 190G faces the substrate 100.

A third isolation layer 136 has a third auxiliary protrusion structure 136P. A third bottom electrode 146 is conformal with the third auxiliary protrusion structure 136P, and therefore the third bottom electrode 146 has a protrusion 146P corresponding to the third auxiliary protrusion structure 136P. A hole injection layer 160 is conformal with the protrusion 146P that has the third bottom electrode 146 and that corresponds to the third auxiliary protrusion structure 136P, and therefore the hole injection layer 160 has a protrusion 160Pc corresponding to the third auxiliary protrusion structure 136P. A hole transport layer 170 is conformal with the protrusion 160Pc that has the hole injection layer 160 and that corresponds to the third auxiliary protrusion structure 136P, and therefore the hole transport layer 170 has a protrusion 170Pc corresponding to the third auxiliary protrusion structure 136P. A third light-emitting layer 200 is conformal with the protrusion 170Pc that has the hole transport layer 170 and that corresponds to the third auxiliary protrusion structure 136P, and therefore the third light-emitting layer 200 covers the protrusion 170Pc that has the hole transport layer 170 and that corresponds to the third auxiliary protrusion structure 136P. In the present embodiment, a location of the third auxiliary protrusion structure 136P corresponds to a third groove structure 200G of the third light-emitting layer 200, and therefore the third groove structure 200G covers the protrusion 170Pc that has the hole transport layer 170 and that corresponds to the third auxiliary protrusion structure 136P. In the present embodiment, the third groove structure 200G faces the substrate 100.

Based on the foregoing, locations of the first groove structure 180G, the second groove structure 190G, and the third groove structure 200G correspond to the first auxiliary protrusion structure 132P, the second auxiliary protrusion structure 134P, and the third auxiliary protrusion structure 136P, and therefore a first top electrode 222, a second top electrode 224, and a third top electrode 226 formed on the first light-emitting layer 180, the second light-emitting layer 190, and the third light-emitting layer 200 may be relatively even.

Figure 5A:
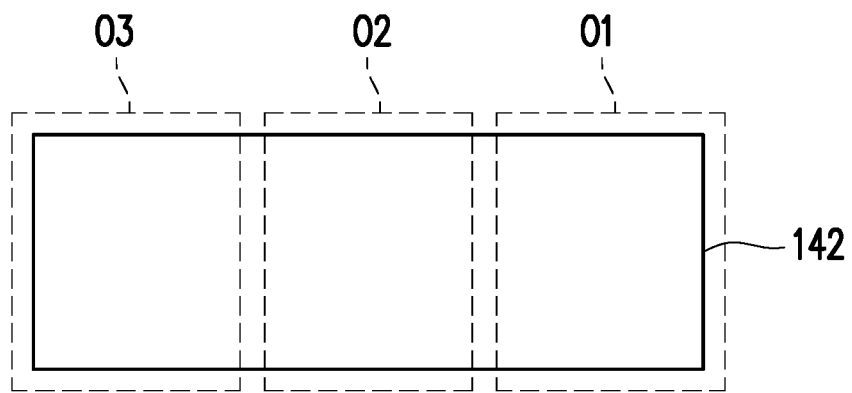
FIG. 5A is a schematic top view of a bottom electrode and an opening of a mask according to an embodiment of the disclosure.
Figure 5B:
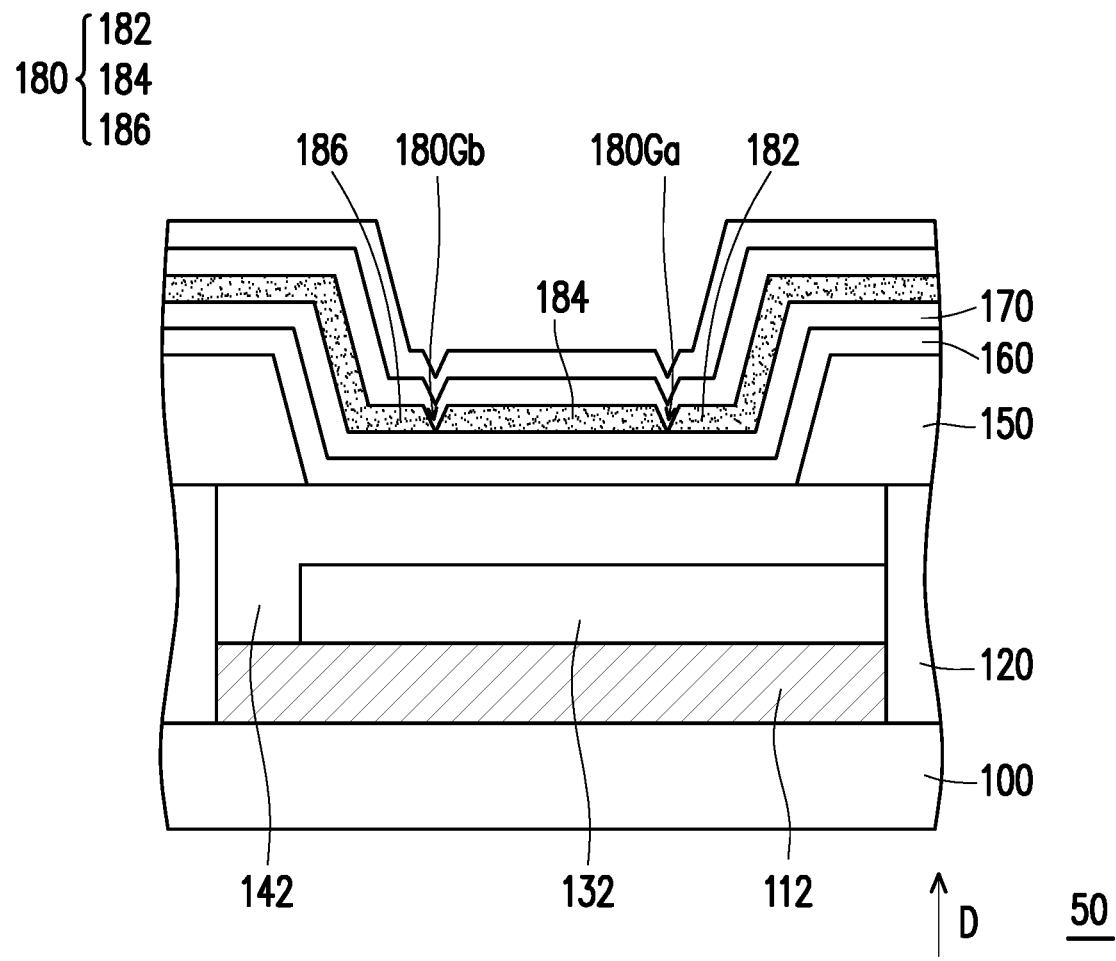
FIG. 5B is a schematic cross-sectional view of a display apparatus according to an embodiment of the disclosure.

FIG. 5A is a schematic top view of a bottom electrode and an opening of a mask according to an embodiment of the disclosure. FIG. 5B is a schematic cross-sectional view of a display apparatus according to an embodiment of the disclosure. It needs to be noted herein that element numerals and some content in the embodiments of FIG. 5A and FIG. 5B are the same as that in the embodiments of FIG. 2A to FIG. 2G, and same or similar numerals are used to represent same or similar elements, and descriptions about same technical content are omitted. For the description of the omitted part, reference may be made to the foregoing embodiments, and the descriptions thereof are omitted herein.

In the present embodiment, a first light-emitting layer 180 of the display apparatus 50 includes a first light-emitting material layer 182, a second light-emitting material layer 184, and a third light-emitting material layer 186. The first light-emitting material layer 182, the second light-emitting material layer 184, and the third light-emitting material layer 186 are formed respectively through a first opening O1 of a first mask, a second opening O2 of a second mask, and a third opening O3 of a third mask. As shown in FIG. 5A, the first opening O1 of the first mask corresponds to a location of the first bottom electrode 142, the second opening O2 of the second mask corresponds to a location of the first bottom electrode 142, and the third opening O3 of the third mask corresponds to a location of the first bottom electrode 142. The first opening O1, the second opening O2, and the third opening O3 have same or different sizes.

In the present embodiment, the first light-emitting material layer 182, the second light-emitting material layer 184, and the third light-emitting material layer 186 are sequentially formed on the first bottom electrode 142. The first light-emitting material layer 182, the second light-emitting material layer 184, and the third light-emitting material layer 186 include same materials.

With reference to FIG. 5A and FIG. 5B, the location to which the first opening O1 of the first mask corresponds and that has the first bottom electrode 142, the location to which the second opening O2 of the second mask corresponds and that has the first bottom electrode 142, and the location to which the third opening O3 of the third mask corresponds and that has the first bottom electrode 142 are different from each other. There is a first groove structure 180Ga between the first light-emitting material layer 182 and the second light-emitting material layer 184, and there is a second groove structure 180Gb between the second light-emitting material layer 184 and the third light-emitting material layer 186.

In the present embodiment, the first light-emitting layer 180 with the first groove structure 180Ga and the second groove structure 180Gb is formed using the first mask, the second mask, and the third mask. Therefore, sizes of the first opening O1, the second opening O2, and the third opening O3 may be reduced, so that the first light-emitting layer 180 does not easily overlap other bottom electrodes except the first bottom electrode 142 in a direction D perpendicular to the substrate 100.

In the present embodiment, a light-emitting layer with a groove structure or a protrusion structure is formed via three fine metal mask processes, and therefore a single light-emitting layer does not easily overlap two bottom electrodes at the same time in a direction perpendicular to a substrate, thereby improving a color mixing problem of the display apparatus.

Figure 6A:
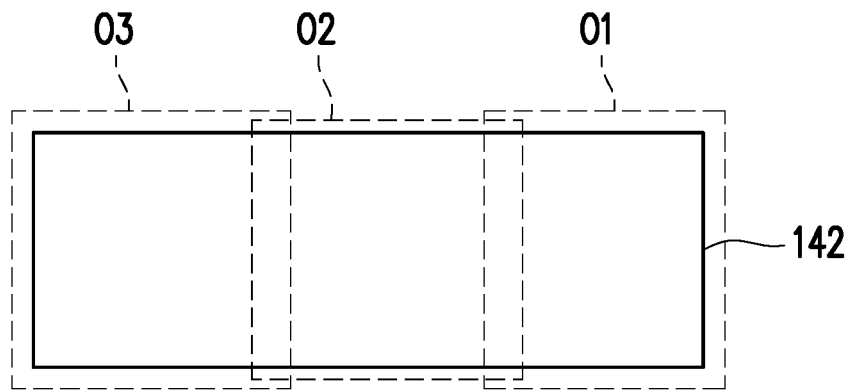
FIG. 6A is a schematic top view of a bottom electrode and an opening of a mask according to an embodiment of the disclosure.
Figure 6B:
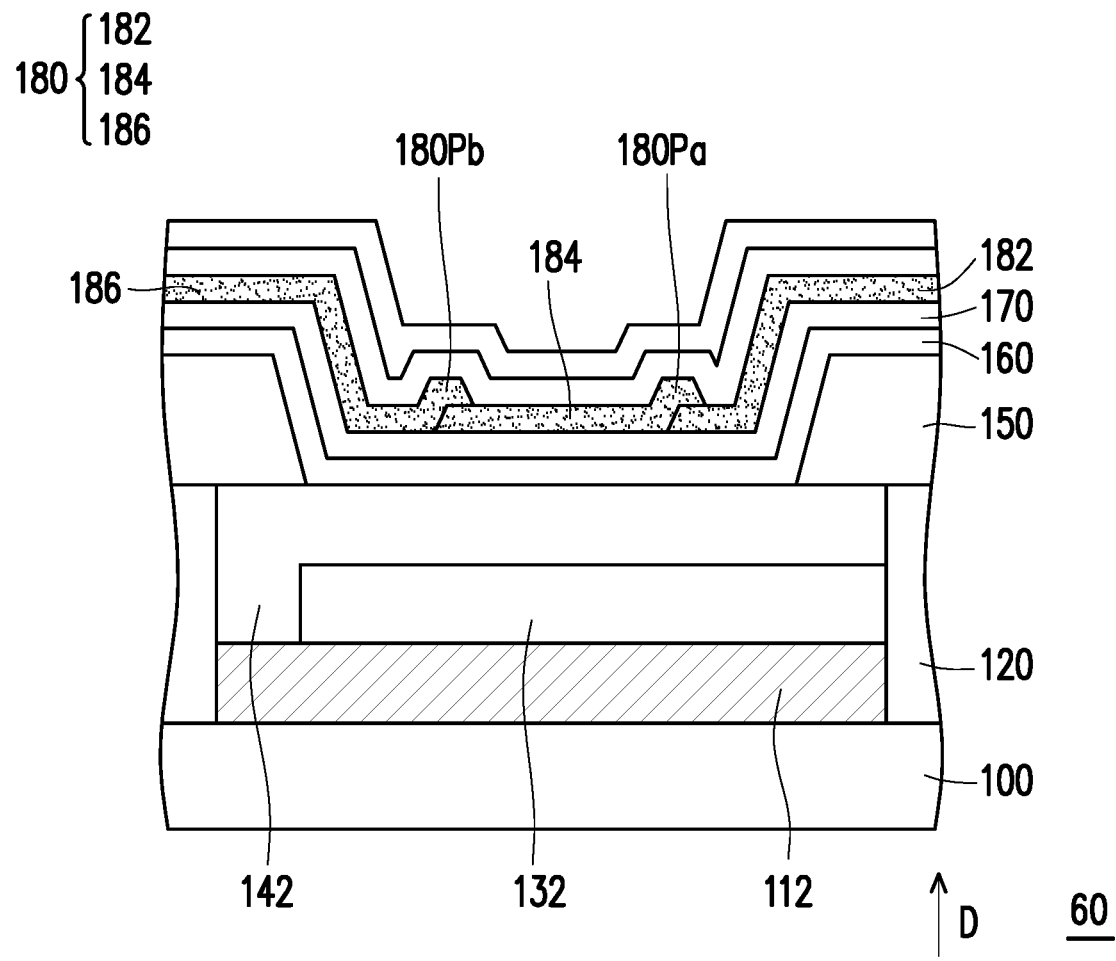
FIG. 6B is a schematic cross-sectional view of a display apparatus according to an embodiment of the disclosure.

FIG. 6A is a schematic top view of a bottom electrode and an opening of a mask according to an embodiment of the disclosure. FIG. 6B is a schematic cross-sectional view of a display apparatus according to an embodiment of the disclosure. It needs to be noted herein that element numerals and some content in the embodiments of FIG. 6A and FIG. 6B are the same as that in the embodiments of FIG. 5A and FIG. 5B, and same or similar numerals are used to represent same or similar elements, and descriptions about same technical content are omitted. For the description of the omitted part, reference may be made to the foregoing embodiments, and the descriptions thereof are omitted herein.

In the present embodiment, a first light-emitting layer 180 of the display apparatus 60 includes a first light-emitting material layer 182, a second light-emitting material layer 184, and a third light-emitting material layer 186. The first light-emitting material layer 182, the second light-emitting material layer 184, and the third light-emitting material layer 186 are formed respectively through a first opening O1 of a first mask, a second opening O2 of a second mask, and a third opening O3 of a third mask. As shown in FIG. 6A, the first opening O1 of the first mask corresponds to a location of the first bottom electrode 142, the second opening O2 of the second mask corresponds to a location of the first bottom electrode 142, and the third opening O3 of the third mask corresponds to a location of the first bottom electrode 142. The first opening O1, the second opening O2, and the third opening O3 have same or different sizes.

In the present embodiment, the first light-emitting material layer 182, the second light-emitting material layer 184, and the third light-emitting material layer 186 are sequentially formed on the first bottom electrode 142. The first light-emitting material layer 182, the second light-emitting material layer 184, and the third light-emitting material layer 186 include same materials.

As shown in FIG. 6A and FIG. 6B, the location to which the first opening O1 of the first mask corresponds and that has the first bottom electrode 142, the location to which the second opening O2 of the second mask corresponds and that has the first bottom electrode 142, and the location to which the third opening O3 of the third mask corresponds and that has the first bottom electrode 142 are different from each other. There is a first protrusion structure 180Pa at an overlapping portion where the first light-emitting layer 182 and the second light-emitting layer 184 are overlapped, and there is a second protrusion structure 180Pb at an overlapping portion where the second light-emitting layer 184 and the third light-emitting layer 186 are overlapped.

In the present embodiment, the first light-emitting layer 180 with the first protrusion structure 180Pa and the second protrusion structure 180Pb is formed using the first mask, the second mask, and the third mask. Therefore, sizes of the first opening O1, the second opening O2, and the third opening O3 may be reduced, so that the first light-emitting layer 180 does not easily overlap other bottom electrodes except the first bottom electrode 142 in a direction D perpendicular to the substrate 100.

In the present embodiment, a light-emitting layer with a groove structure or a protrusion structure is formed via three fine metal mask processes, and therefore a single light-emitting layer does not easily overlap two bottom electrodes at the same time in a direction perpendicular to a substrate, thereby improving a color mixing problem of the display apparatus.

Based on the foregoing, a resonant cavity of a light-emitting diode is controlled by adjusting a thickness of the first isolation layer, a thickness of the second isolation layer, and a thickness of the third isolation layer, and thicknesses of the electric hole transport layer at an overlapping portion where the first light-emitting layer, the second light-emitting layer, and the third light-emitting layer are overlapped may be the same. Therefore, the display apparatus does not have a problem of color unevenness caused by inaccurate alignment of the hole transport layer. In the present embodiment, a light-emitting layer with a groove structure or a protrusion structure is formed via at least two fine metal mask processes, and therefore a single light-emitting layer does not easily overlap two bottom electrodes at the same time in a direction perpendicular to a substrate, thereby improving a color mixing problem of the display apparatus.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A display apparatus comprising:
a substrate; and
a first sub-pixel located on the substrate, the first sub-pixel comprising:
a first bottom electrode;
a first light-emitting layer located on the first bottom electrode, the first light-emitting layer comprising a first groove structure or a first protrusion structure, wherein the first light-emitting layer has a first side and a second side opposite to the first side, the first groove structure or the first protrusion structure is located at the first side, and a portion of the second side opposite to the first groove structure or the first protrusion structure is flat, and wherein
the first protrusion structure of the first light-emitting layer is thicker than a non-protrusion portion of the first light-emitting layer when the first light-emitting layer comprises the first protrusion structure, and
the first groove structure of the first light-emitting layer is thinner than a non-groove portion of the first light-emitting layer when the first light-emitting layer comprises the first groove structure; and
a first top electrode located on the first light-emitting layer.

2. The display apparatus according to claim 1, wherein the first sub-pixel further comprises a first isolation layer located between the first bottom electrode and the substrate.

3. The display apparatus according to claim 2, wherein the first sub-pixel further comprises a first reflecting layer located between the first isolation layer and the substrate, and the first bottom electrode is electrically connected to the first reflecting layer through a first via in the first isolation layer.

4. The display apparatus according to claim 2, wherein the first light-emitting layer comprises the first protrusion structure, and the first isolation layer comprises a first auxiliary groove structure whose location corresponds to the first protrusion structure.

5. The display apparatus according to claim 2, wherein the first light-emitting layer comprises the first groove structure, a depth of the first groove structure is 0.1 T to 1 T, and T is a thickness of the first light-emitting layer around the first groove structure.

6. The display apparatus according to claim 2, wherein the first light-emitting layer comprises the first groove structure, and the first isolation layer comprises a first auxiliary protrusion structure whose location corresponds to the first groove structure.

7. The display apparatus according to claim 2, wherein the first light-emitting layer comprises the first protrusion structure, a height of the first protrusion structure is 0.1 T to 1 T, and T is a thickness of the first light-emitting layer around the first protrusion structure.

8. The display apparatus according to claim 2, further comprising:
a second sub-pixel located on the substrate, the second sub-pixel comprising:
a second bottom electrode;
a second light-emitting layer located on the first bottom electrode, the second light-emitting layer comprising a second groove structure or a second protrusion structure;
a second top electrode located on the first light-emitting layer; and
a second isolation layer located between the second bottom electrode and the substrate, wherein a thickness of the first isolation layer is different from a thickness of the second isolation layer.

9. The display apparatus according to claim 2, wherein the first isolation layer is made of silicon oxide, silicon nitride, silicon oxynitride, hafnium oxide, indium tin oxide, gallium zinc oxide, zinc oxide, indium zinc oxide, or a combination thereof.

10. The display apparatus according to claim 2, wherein a thickness of the first isolation layer is 5 nanometers to 150 nanometers.

11. The display apparatus according to claim 2, wherein a resolution of the display apparatus is 400 ppi to 3000 ppi.

12. A manufacturing method of a display apparatus, comprising:
providing a substrate;
forming a first bottom electrode on the substrate;
forming a first light-emitting material layer on the first bottom electrode by using a first mask as a mask;
forming a second light-emitting material layer on the first bottom electrode by using a second mask as a mask, the first light-emitting material layer and the second light-emitting material layer constituting a first light-emitting layer, the first light-emitting layer comprising a first groove structure located between the first light-emitting material layer and the second light-emitting material layer or a first protrusion structure located at an overlapping portion where the first light-emitting material layer and the second light-emitting material layer are overlapped, wherein the first light-emitting layer has a first side and a second side opposite to the first side, the first groove structure or the first protrusion structure is located at the first side, and a portion of the second side opposite to the first groove structure or the first protrusion structure is flat, and wherein the first protrusion structure of the first light-emitting layer is thicker than a non-protrusion portion of the first light-emitting layer when the first light-emitting layer comprises the first protrusion structure, and the first groove structure of the first light-emitting layer is thinner than a non-groove portion of the first light-emitting layer when the first light-emitting layer comprises the first groove structure; and forming a first top electrode located on the first light-emitting layer.

13. The manufacturing method according to claim 12, wherein the first mask comprises a first opening partially overlapping the first bottom electrode, and the second mask comprises a second opening partially overlapping the first bottom electrode.

14. The manufacturing method according to claim 12, further comprising:

forming a first reflecting layer on the substrate;

forming a first isolation layer on the first reflecting layer, wherein the first isolation layer comprises a first via; and forming a first bottom electrode on the first isolation layer, wherein the first bottom electrode is electrically connected to the first reflecting layer through the first via in the first isolation layer.

15. The manufacturing method according to claim 14, wherein the first light-emitting layer comprises the first groove structure, and the first isolation layer comprises a first auxiliary groove structure whose location corresponds to the first protrusion structure.

16. The manufacturing method according to claim 14, wherein the first light-emitting layer comprises the first groove structure, a depth of the first groove structure is 0.1 T to 1 T, and T is a thickness of the first light-emitting layer around the first groove structure.

17. The manufacturing method according to claim 14, wherein the first light-emitting layer comprises the first protrusion structure, and the first isolation layer comprises a first auxiliary groove structure whose location corresponds to the first protrusion structure.

18. The manufacturing method according to claim 14, wherein the first light-emitting layer comprises the first protrusion structure, a height of the first protrusion structure is 0.1 T to 1 T, and T is a thickness of the first light-emitting layer around the first protrusion structure.

19. The manufacturing method according to claim 12, further comprising:

forming a second bottom electrode on the substrate, wherein the first bottom electrode and the second bottom electrode are simultaneously formed;

forming a third light-emitting material layer on the second bottom electrode by using a third mask as a mask;

forming a fourth light-emitting material layer on the second bottom electrode by using a fourth mask as a mask, the third light-emitting material layer and the fourth light-emitting material layer constituting a second light-emitting layer, the second light-emitting layer comprising a second groove structure located between the third light-emitting material layer and the fourth light-emitting material layer or a second protrusion structure located at an overlapping portion where the third light-emitting material layer and the fourth light-emitting material layer are overlapped; and forming a second top electrode on the second light-emitting layer, wherein the first top electrode and the second top electrode are simultaneously formed.

20. The manufacturing method according to claim 19, further comprising:

forming a hole injection layer on the first bottom electrode and the second bottom electrode;

forming a hole transport layer on the hole injection layer; and forming the first light-emitting material layer, the second light-emitting material layer, the third light-emitting material layer, and the fourth light-emitting material layer on the hole transport layer.

* * * * *